US010976655B2

(12) United States Patent
Lu et al.

(10) Patent No.: US 10,976,655 B2
(45) Date of Patent: Apr. 13, 2021

(54) EXTREME ULTRAVIOLET LITHOGRAPHY SYSTEM, DEVICE, AND METHOD FOR PRINTING LOW PATTERN DENSITY FEATURES

(71) Applicant: Taiwan Semiconductor Manufacturing Co., Ltd., Hsin-Chu (TW)

(72) Inventors: Yen-Cheng Lu, New Taipei (TW); Shinn-Sheng Yu, Hsinchu (TW); Jeng-Horng Chen, Hsin-Chu (TW); Anthony Yen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/908,449

(22) Filed: Jun. 22, 2020

(65) Prior Publication Data

US 2020/0319545 A1 Oct. 8, 2020

Related U.S. Application Data

(63) Continuation of application No. 16/220,324, filed on Dec. 14, 2018, now Pat. No. 10,691,014, which is a (Continued)

(51) Int. Cl.
*G03B 27/32* (2006.01)
*G03B 27/54* (2006.01)
(Continued)

(52) U.S. Cl.
CPC ............ *G03F 1/26* (2013.01); *G03F 7/70033* (2013.01); *G03F 7/70191* (2013.01); *G03F 7/70308* (2013.01)

(58) Field of Classification Search
CPC ...... G03F 7/70033; G03F 1/26; G03F 7/2002; G03F 7/70266; G03F 7/70633;
(Continued)

(56) References Cited

U.S. PATENT DOCUMENTS 5,329,333 A 7/1994 Noguchi et al.
5,642,183 A 6/1997 Sugihara et al.
(Continued)

FOREIGN PATENT DOCUMENTS

CN 105278256 1/2016
KR 10-2004-0086817 A 10/2004
(Continued)

OTHER PUBLICATIONS

Powell, Forbes R., et al., "Filter Windows for EUV Lithography," 2001, pp. 585-589, vol. 4343, Proceedings of SPIE.
(Continued)

*Primary Examiner* — Mesfin T Asfaw
(74) *Attorney, Agent, or Firm* — Haynes and Boone, LLP

(57) ABSTRACT

A lithography system includes a radiation source configured to generate an extreme ultraviolet (EUV) light. The lithography system includes a mask that defines one or more features of an integrated circuit (IC). The lithography system includes an illuminator configured to direct the EUV light onto the mask. The mask diffracts the EUV light into a 0-th order ray and a plurality of higher order rays. The lithography system includes a wafer stage configured to secure a wafer that is to be patterned according to the one or more features defined by the mask. The lithography system includes a pupil phase modulator positioned in a pupil plane that is located between the mask and the wafer stage. The pupil phase modulator is configured to change a phase of the 0-th order ray.

20 Claims, 27 Drawing Sheets

Related U.S. Application Data continuation of application No. 15/380,717, filed on Dec. 15, 2016, now Pat. No. 10,162,257.

(51) Int. Cl.
*G03F 1/26* (2012.01)
*G03F 7/20* (2006.01)

(58) Field of Classification Search
CPC .... G03F 7/70191; G03F 7/70641; G03F 1/24; G03F 7/70941; G03F 7/70116; G03F 1/22; G03F 1/64; G03F 27/54; G03F 7/70308; G03F 7/70291; G03F 7/70466; G03F 7/70891; G03F 7/70425; G03F 7/70283; G03F 7/70733; G03F 9/7049; G03F 7/70075; G03F 7/70091; G03F 7/70141; G03F 7/70566; G03F 7/70358; G03F 7/70958; G03F 7/705; G03F 1/36; G03F 7/7065; G03F 9/7088; G03F 7/70108; G03F 7/7085; G03F 7/70625; G03F 7/70225; G03F 7/70508; G03F 7/70441
See application file for complete search history.

(56) References Cited

U.S. PATENT DOCUMENTS

| | | |
|---|---|---|
| 6,261,727 B1 | 7/2001 | Wang |
| 6,853,440 B1 | 2/2005 | Van De Pasch et al. |
| 7,842,438 B2 | 11/2010 | Constancias |
| 9,122,166 B2 | 9/2015 | Lu et al. |
| 9,535,334 B2 | 1/2017 | Lu et al. |
| 9,690,186 B2 | 6/2017 | Lu et al. |
| 2005/0282072 A1 | 12/2005 | Hector et al. |
| 2007/0121090 A1 | 5/2007 | Chen et al. |
| 2009/0305147 A1 | 12/2009 | Constancias |
| 2012/0200838 A1 | 8/2012 | De Winter et al. |
| 2013/0132037 A1 | 5/2013 | Kempter |
| 2014/0011120 A1 | 1/2014 | Lu et al. |
| 2016/0033866 A1 | 2/2016 | Lu et al. |
| 2016/0147137 A1 | 5/2016 | Shih et al. |

FOREIGN PATENT DOCUMENTS

| | | |
|---|---|---|
| KR | 20130019384 A | 2/2013 |
| KR | 20160016506 A | 2/2016 |
| KR | 10-2016-0063235 A | 6/2016 |

OTHER PUBLICATIONS

Sewell, Harry, et al., "Materials for Optical Lithography Tool Application," 2009, pp. 127-153, vol. 39, The Annual Review of Material Research.

Chen, Alek, "EUV: Current Status and Future Challenge," Oct. 18, 2012, 35 pages, Semetech Symposium, Hsinchu, Taiwan.

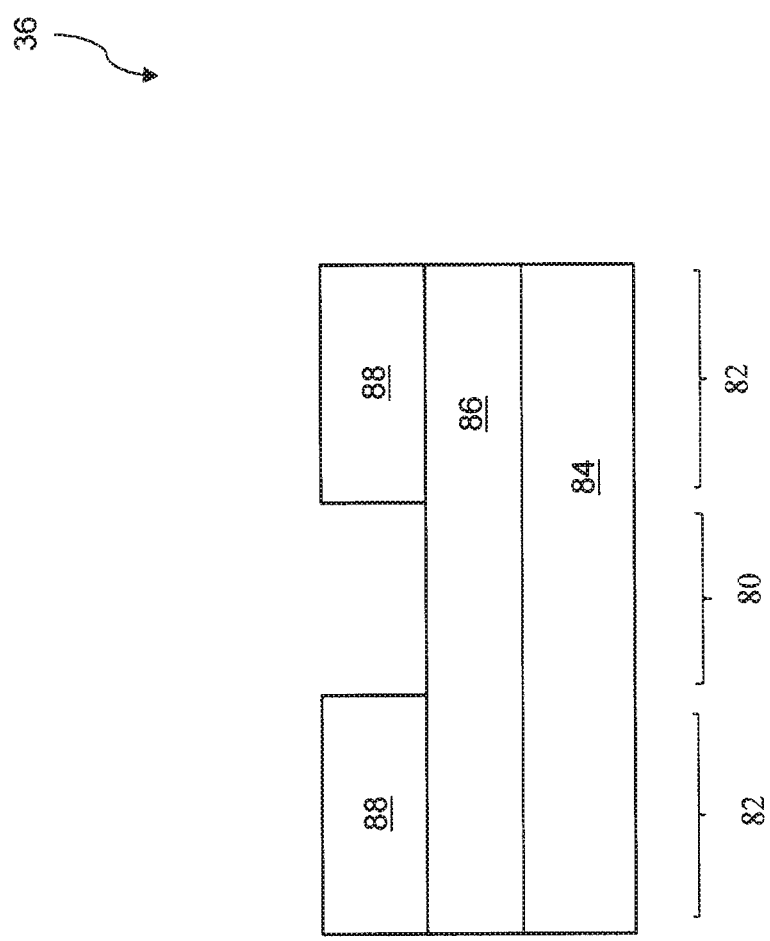

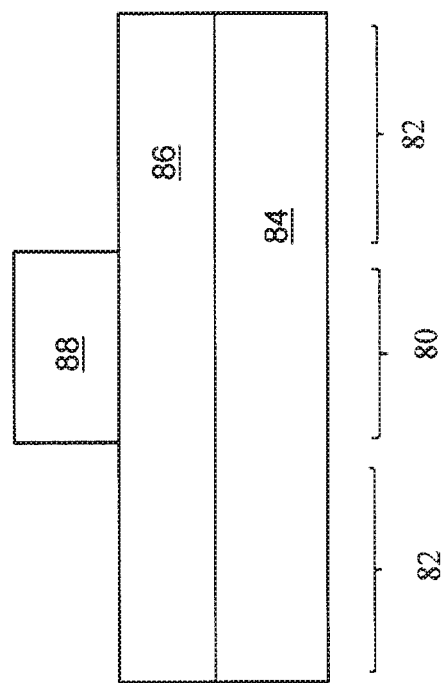

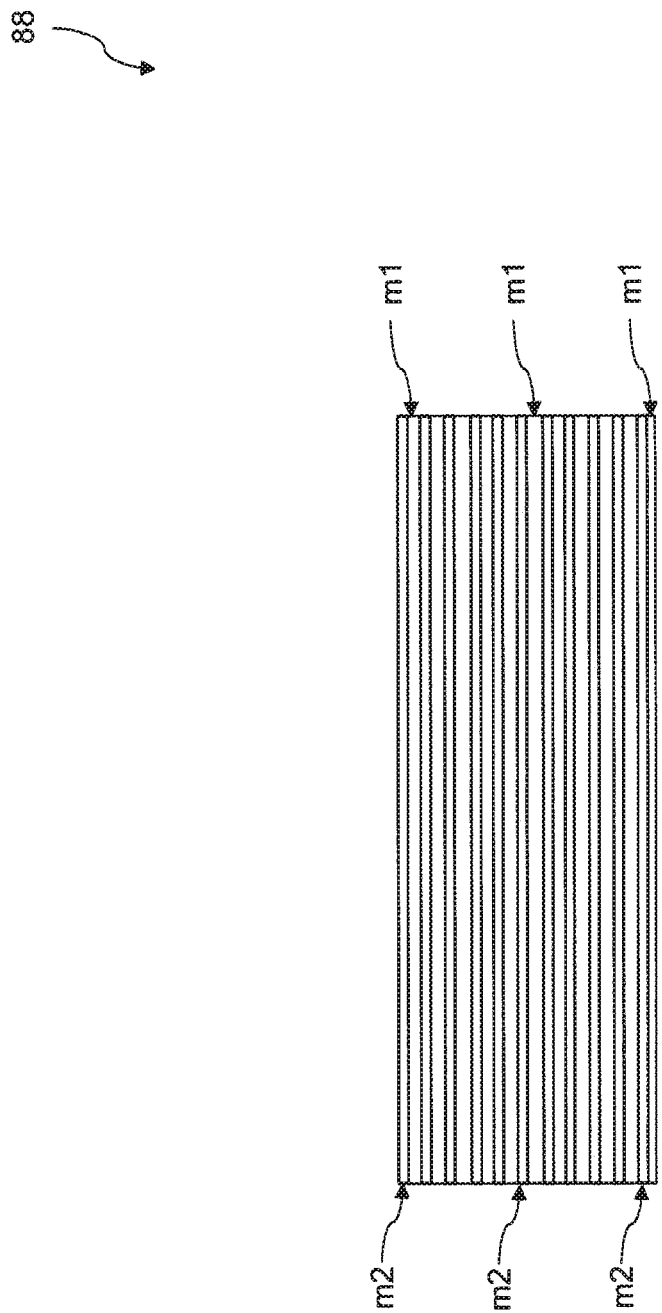

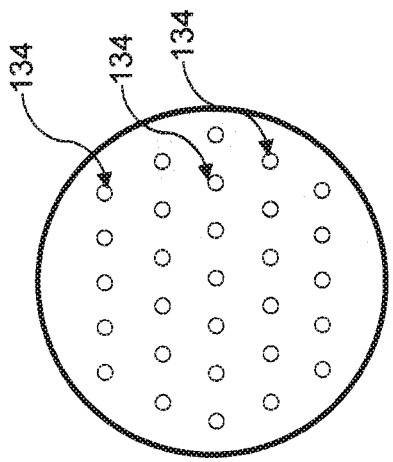
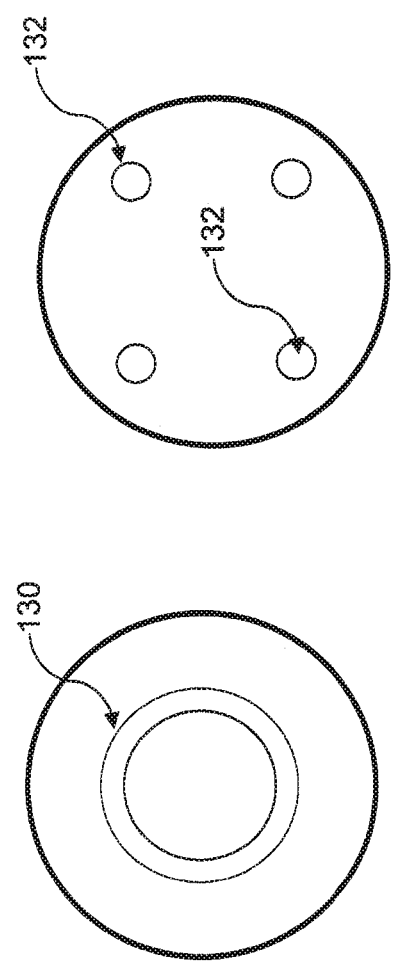
Fig. 9A
Fig. 9B
Fig. 9C
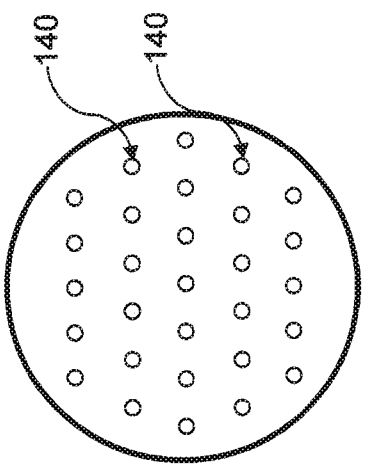
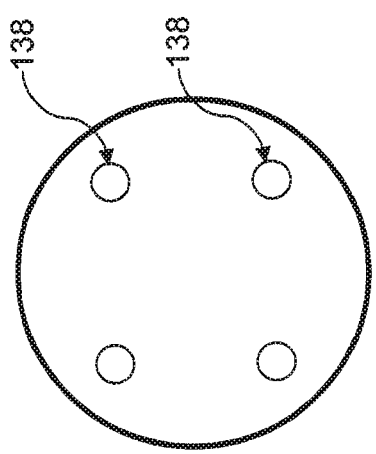
Fig. 10A
Fig. 10B
Fig. 10C

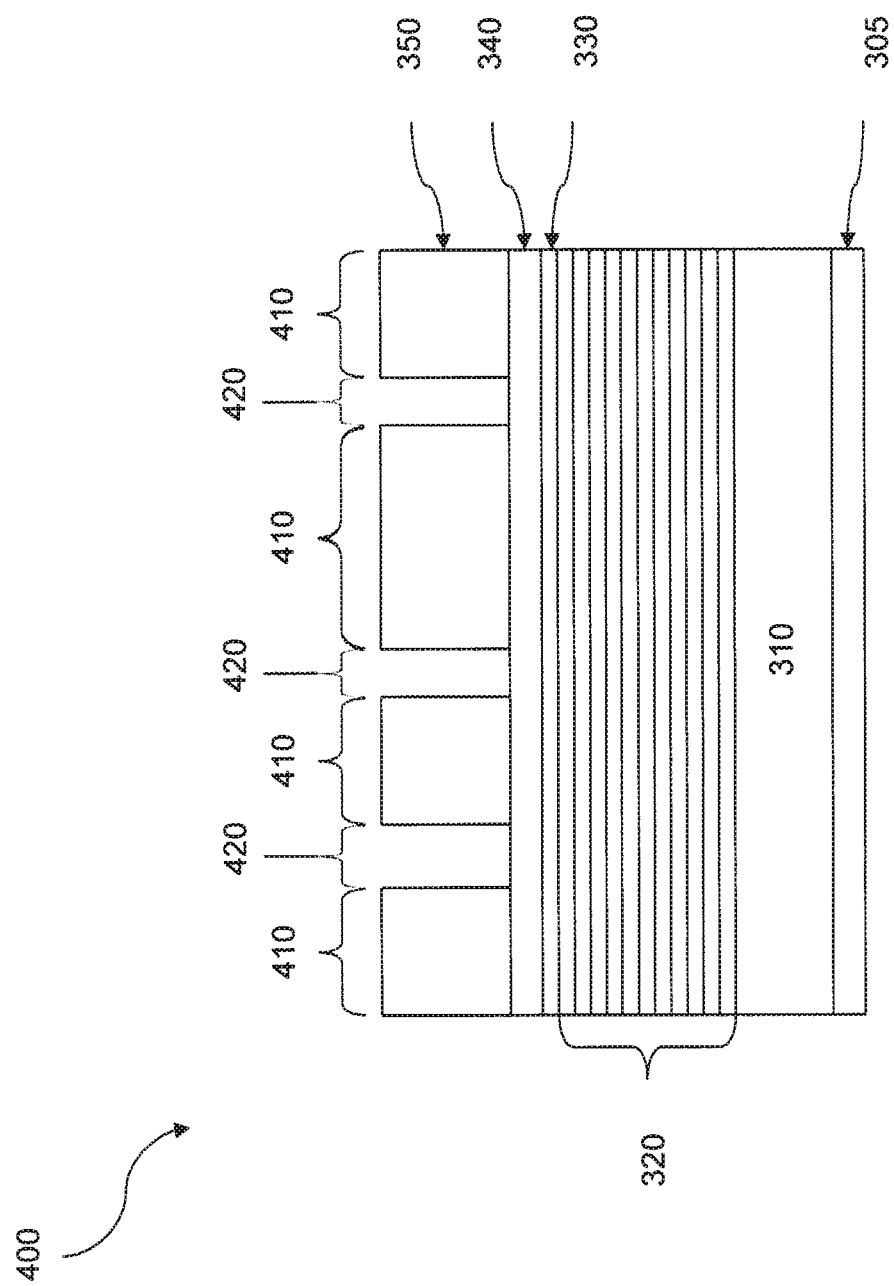

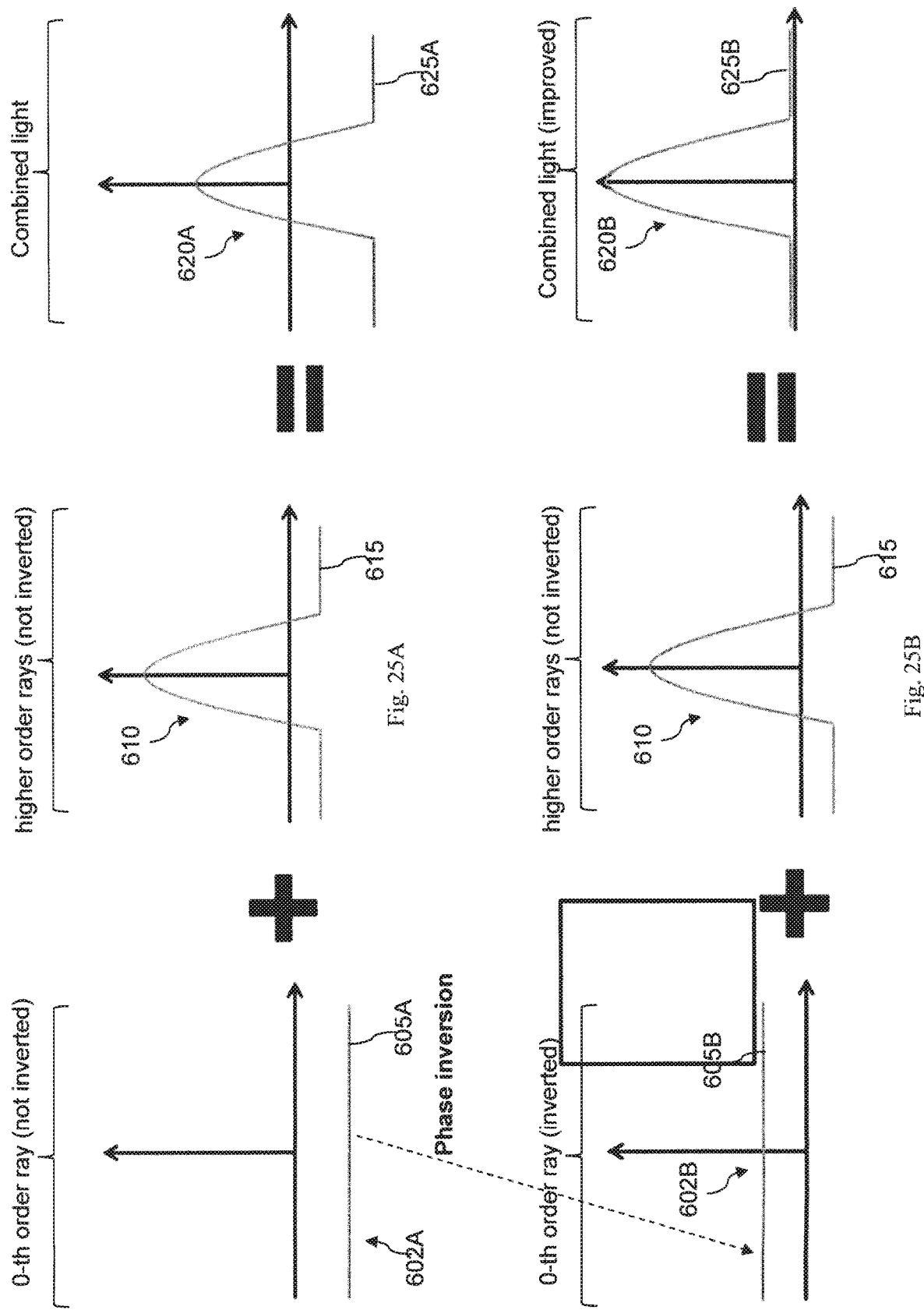

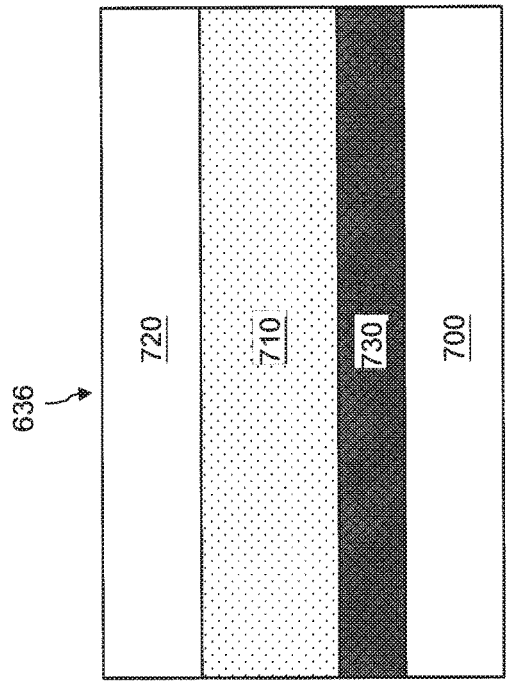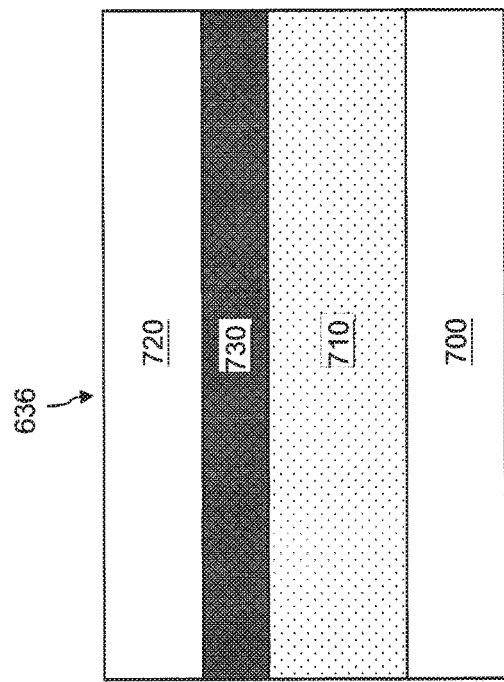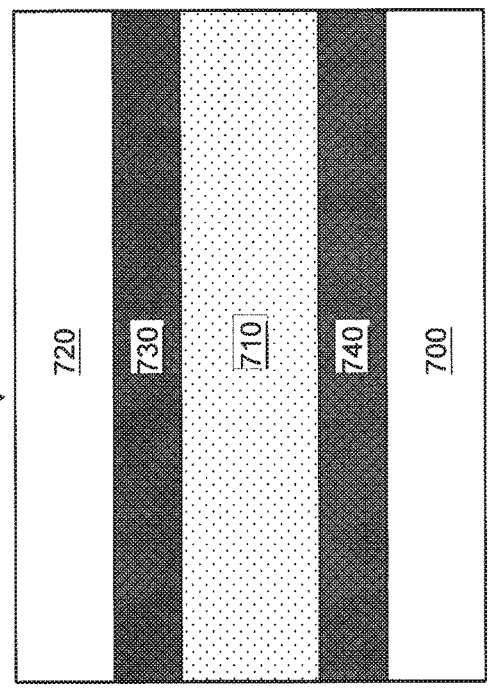

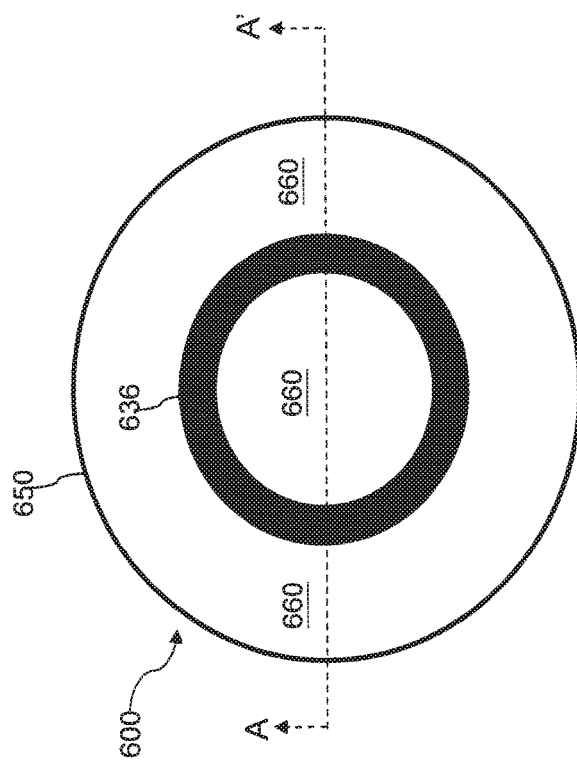
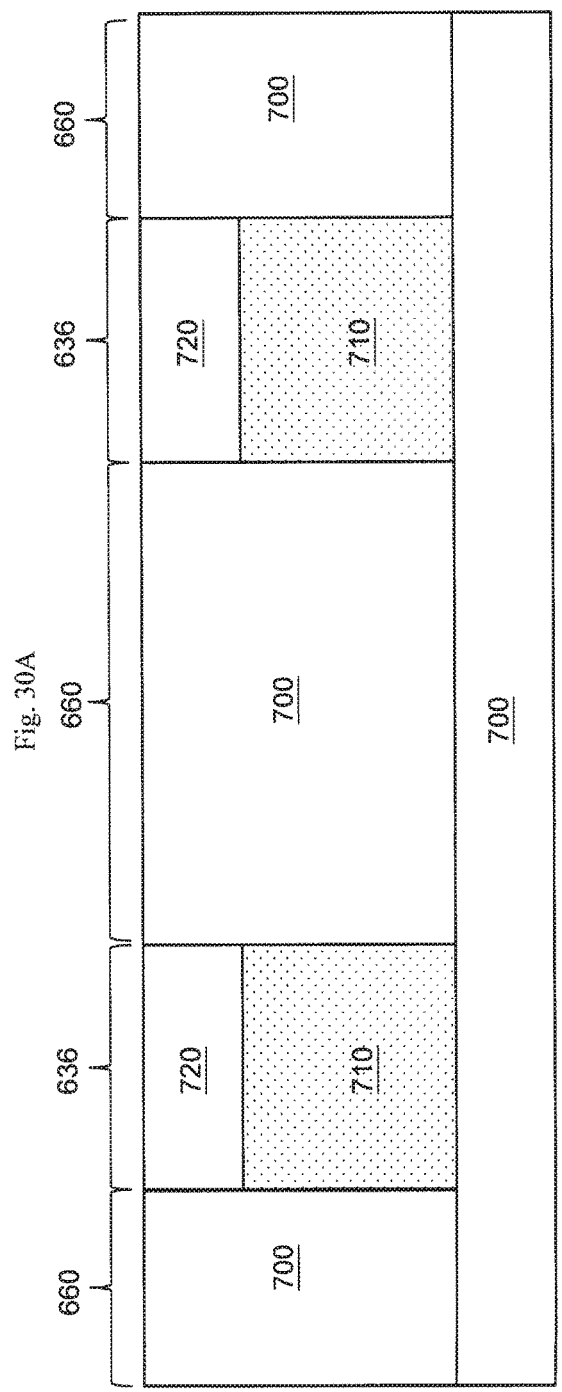
Fig. 30A
Fig. 30B

EXTREME ULTRAVIOLET LITHOGRAPHY SYSTEM, DEVICE, AND METHOD FOR PRINTING LOW PATTERN DENSITY FEATURES

PRIORITY DATA

This application is a continuation application of U.S. patent application Ser. No. 16/220,324, filed Dec. 14, 2018, entitled "IMPROVED EXTREME ULTRAVIOLET LITHOGRAPHY SYSTEM, DEVICE, AND METHOD FOR PRINTING LOW PATTERN DENSITY FEATURES, which is a continuation application of U.S. patent application Ser. No. 15/380,717, filed Dec. 15, 2016, now U.S. Pat. No. 10,162,257, issued Dec. 25, 2018, entitled "IMPROVED EXTREME ULTRAVIOLET LITHOGRAPHY SYSTEM, DEVICE, AND METHOD FOR PRINTING LOW PATTERN DENSITY FEATURES," the entire disclosures of each of which are incorporated herein by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet lithography (EUVL). Other techniques include X-Ray lithography, ion beam projection lithography, electron beam projection lithography, and multiple electron beam maskless lithography.

The EUVL employs scanners using light in the extreme ultraviolet (EUV) region. EUV scanners provide the desired pattern on an absorption layer ("EUV" mask absorber) formed on a reflective mask. Currently, binary intensity masks (BIM) are employed in EUVL for fabricating integrated circuits. For EUV light, all materials are highly absorbing. Thus, reflective optics rather than refractive optics is used. A reflective mask is used. However, the reflectance of EUV mask is very low. The EUV energy is substantially lost on the optical path. The EUV energy reaching the wafer is much less. There are other issues including low throughput issue, especially for a via layer due to the low transmittance through the via.

Therefore, what is needed is the method for a lithography process and the mask structure utilized in the method to address the above issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A and 5B are diagrammatic cross-sectional views of the binary phase mask constructed according to aspects of the present disclosure in two embodiments.

FIGS. 6-8 are a diagrammatic cross-sectional view of the second reflective layer of FIG. 5A (Or 5B) constructed according to aspects of the present disclosure in various embodiments.

FIGS. 9A through 9C are diagrammatic top views of an illuminator used in the lithography system of FIG. 3, constructed according to aspects of the present disclosure in various embodiments.

FIGS. 10A through 10C are diagrammatic top views of a pupil filter used in the lithography system of FIG. 3, constructed according to aspects of the present disclosure in various embodiments.

FIG. 22 is a diagrammatic cross-sectional view of various aspects of one embodiment of a mask at various stages of a lithography process constructed according to aspects of the present disclosure.

FIGS. 25A-25B illustrate the exposure light field distribution before and after the pupil phase modulator constructed according to aspects of the present disclosure in one embodiment.

FIGS. 27, 28A, 28B, and 28C are diagrammatic cross-sectional views of a portion of a pupil phase modulator according to embodiments of the present disclosure.

FIGS. 30A-30B are diagrammatic planar and cross-sectional views of another pupil phase modulator according to embodiments of the present disclosure.

DETAILED DESCRIPTION

Figure 1:
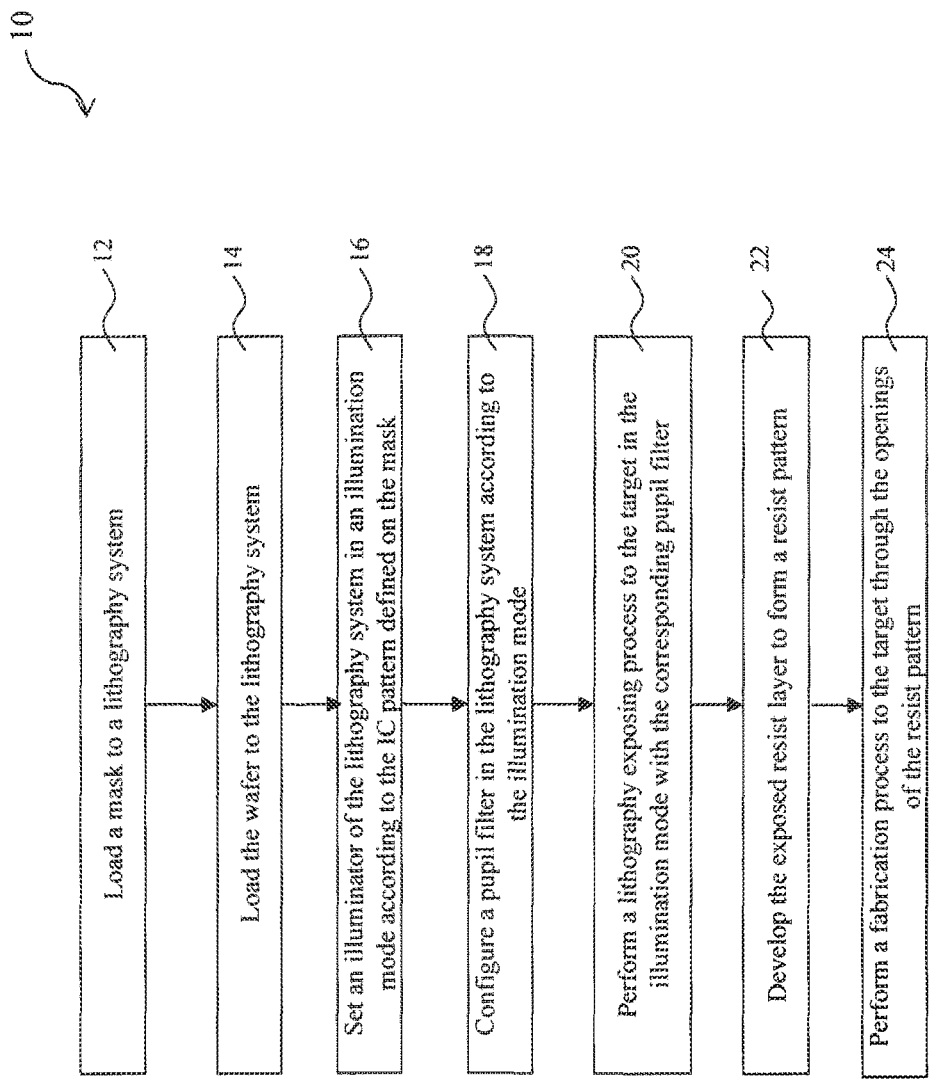
FIG. 1 is a flowchart of a lithography process constructed according to aspects of the present disclosure in various embodiments.

The following disclosure provides many different embodiments, or examples, for implementing different features. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 10 to perform a lithography process in an integrated circuit fabrication constructed according to aspects of the present disclosure in various embodiments. The method 10, the lithography system and the photomask used by the method 10 are described with reference to FIG. 1 and other figures.

Referring to FIG. 1, the method 10 includes an operation 12 by loading to a lithography system 30 with a photomask (mask or reticle) 36. In the present disclosure, the mask 36 is designed to have phase shift and with two mask states. Therefore, the mask 36 is a phase shift mask with two phase states, therefore being referred to as binary phase mask (BPM). The lithography system 30 and the mask 36 are described below respectively.

Figure 2:
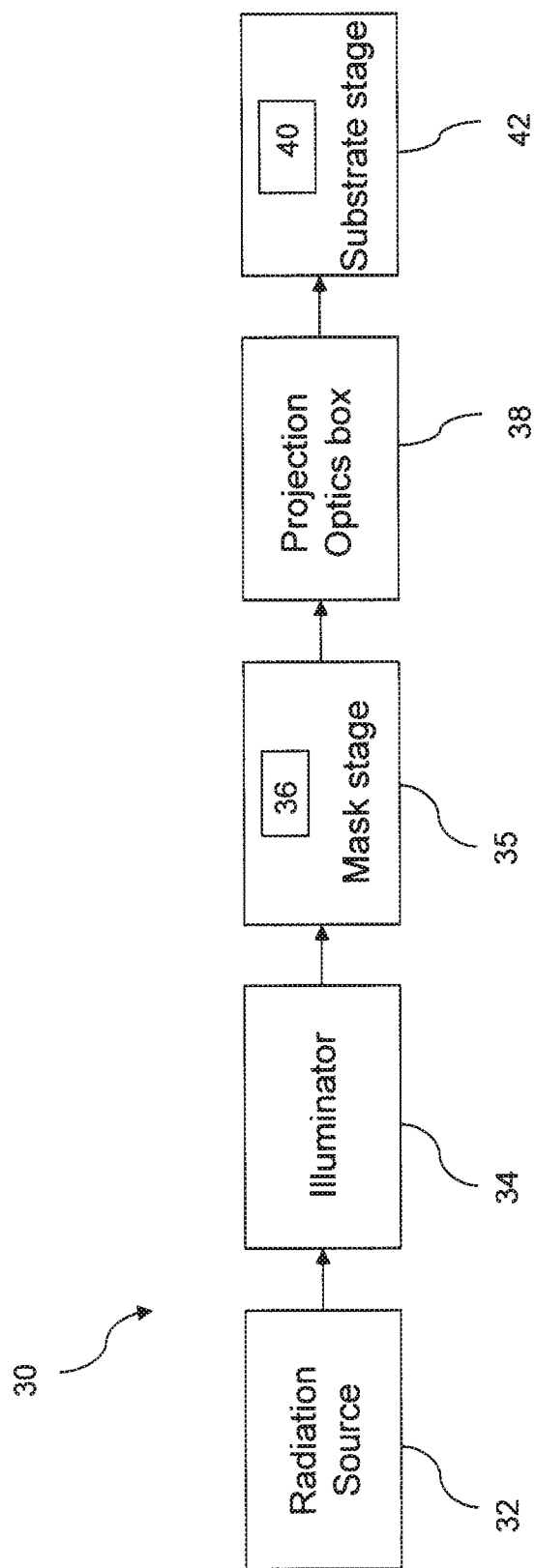
FIG. 2 is a block diagram of a lithography system for implementing a mask structure constructed according to aspects of the present disclosure in one or more embodiment.

FIG. 2 illustrates a block diagram of the lithography system 30 for performing a lithography exposure process. The lithography system 30 is also illustrated, in portion, in FIG. 3 in a schematic view. In the present embodiment, the lithography system 30 is an extreme ultraviolet (EUV) lithography system designed to expose a resist (or photoresist) layer by EUV. The resist layer is sensitive to the EUV radiation. The EUV lithography system 30 employs a radiation source 32 to generate EUV light, such as EUV light having a wavelength ranging from about 1 nm to about 100 nm. In one particular example, the EUV radiation source 32 generates a EUV light with a wavelength centered at about 13.5 nm.

The EUV lithography system 30 also employs an illuminator 34. In various embodiments, the illuminator 34 includes various refractive optic components, such as a single lens or a lens system having multiple lenses (zone plates) or reflective optics, such as a single mirror or a mirror system having multiple mirrors in order to direct light from the radiation source 32 onto a mask 36. In the present embodiment where the radiation source 32 that generates light in the EUV wavelength range, reflective optics is employed. Refractive optics, however, can also be realized by zoneplates for example. In the present embodiment, the illuminator 34 is operable to configure the mirrors to provide an off-axis illumination (OAI) to illuminate the mask 36. In one example, the mirrors of the illuminator 34 are switchable to reflect EUV light to different illumination positions. In another embodiment, a stage prior to the illuminator 34 may additionally include other switchable mirrors that are controllable to direct the EUV light to different illumination positions with the mirrors of the illuminator 34. Accordingly, the lithography system 30 is able to achieve different illumination modes without sacrificing the illumination energy.

The EUV lithography system 30 also includes a mask stage 35 configured to secure a photomask 36 (in the present disclosure, the terms of mask, photomask, and reticle are used to refer to the same item). The mask 36 may be a transmissive mask or a reflective mask. In the present embodiment, the mask 36 is a reflective mask such as described in further detail below.

The EUV lithography system 30 also employs the POB 38 (projection optics box) for imaging the pattern of the mask 36 on to a target 40 (such as a semiconductor wafer) secured on a substrate stage 42 of the lithography system 30. The POB 38 may have refractive optics or reflective optics. The radiation reflected from the mask 36 (e.g., a patterned radiation) is collected by the POB 38. In one embodiment, the POB 38 may include a magnification of less than one (thereby reducing the patterned image included in the radiation).

The structure of the mask 36 and the method making the same will be further described later according to various embodiments. The mask fabrication process includes two operations: a blank mask fabrication process and a mask patterning process. During the blank mask fabrication process, a blank mask is formed by deposing suitable layers (e.g., multiple reflective layers) on a suitable substrate. The blank mask is patterned during the mask patterning process to have a design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. Several masks (for example, a set of 15 to 30 masks) may be used to construct a complete IC. In general, various masks are fabricated for being used in various processes.

Figure 4:
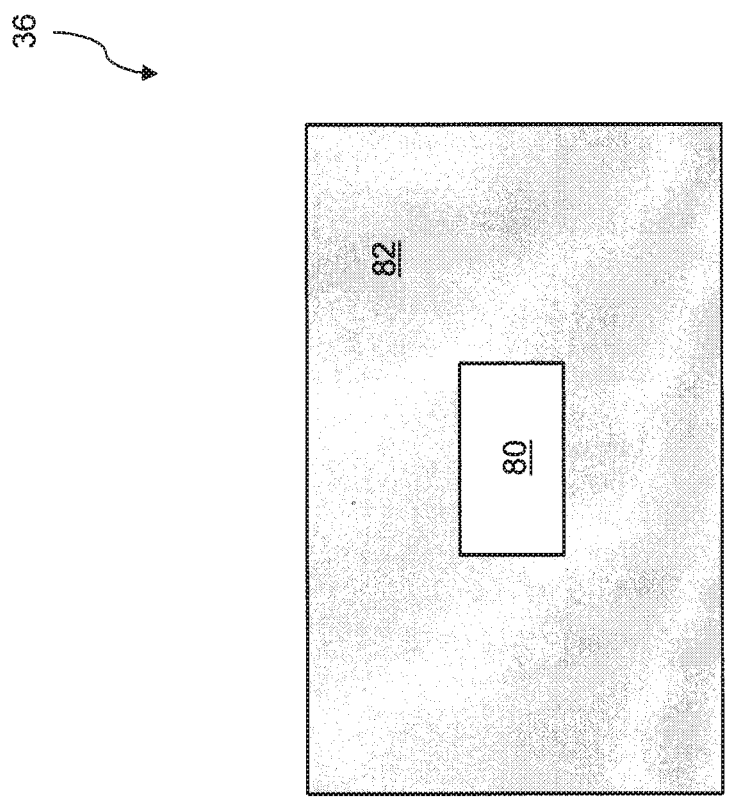
FIG. 4 is a top view of a binary phase mask constructed according to aspects of the present disclosure in one or more embodiment.

The mask 36 incorporates phase-shifting mask (PSM) technique and is designed to achieve the enhanced illumination intensity when used with the lithography system 30 and the method 10. In the present embodiment, the mask 36 is a binary phase mask. FIG. 4 illustrates a top view of the mask 36 and FIG. 5A is a sectional view of the mask 36, constructed according to aspects of the present disclosure.

Referring to FIG. 4, the mask 36 includes a plurality of main features (main polygons) 80. The rest region without main patterns is referred to as field 82. A main polygon is a IC feature or a portion of the IC feature that will be imaged to the target 40 (a wafer in the present example). In one example, the main feature 80 is an opening that defines a via in a via layer (or a contact in a contact layer) to be formed on the semiconductor wafer. The pattern in the mask 36 defines the via layer with a plurality of vias (or the contact layer with plurality of contacts). In another example, the main feature 80 is an opening that defines a cut feature for double or multiple patterning. The pattern in the mask 36 defines a cut pattern with a plurality of cut features designed to form a circuit pattern (such as gates or metal lines) with one or more main patterns defined on corresponding mask by two or more exposures. Double patterning as one example of the multiple patterning is further described to illustrate the cut pattern. During double patterning, a first mask defines main features (such as metal lines), and a second mask defines cut features where each cut feature break (cut) the corresponding main feature (such as one metal line) into two main features (such as two metal lines) through a double patterning process. In yet another embodiment, the pattern in the mask 36 may further include other features, such as optical proximity correction (OPC) features to enhance imaging effect and/or dummy features to improve performance of other fabrication operations (such as CMP, and thermal annealing). In the present embodiment, the pattern density of the pattern on the mask 36 has a low pattern density, such as lower than about 25% in one example. In other example such as a pattern with a reversed tone where the pattern density is calculated by the complimentary areas on the mask, the pattern density is greater than 75%.

Referring to FIG. 5A, the mask 36 includes a mask substrate 84, such as a substrate made of low thermal expansion material (LTEM). In various example, the LTEM material includes $TiO_2$ doped $SiO_2$, or other low thermal expansion materials with low thermal expansion. The mask substrate 84 serves to minimize image distortion due to mask heating or other factors. In furtherance of the present embodiment, the mask substrate 84 of the LTEM includes a suitable material with a low defect level and a smooth surface. In another embodiment, a conductive layer may be additionally disposed on back surface of the mask substrate 84 for the electrostatic chucking purpose. In one example, the conductive layer includes chromium nitride (CrN), though other compositions are possible.

The mask 36 includes a reflective multilayer (ML) 86 disposed over the mask substrate 84 on the front surface. The ML 86 is also referred to as a first reflective layer, to avoid confusion when another reflective layer to be introduced later. According to Fresnel equations, light reflection will occur when light propagates across the interface between two materials of different refractive indices. The reflected light is larger when the difference of refractive indices is larger. To increase the reflected light, one may also increase the number of interfaces by deposing a multilayer of alternating materials and let lights reflected from different interfaces interfere constructively by choosing appropriate thickness for each layer inside the multilayer. However, the absorption of the employed materials for the multilayer limits the highest reflectivity that can be achieved. The ML 86 includes a plurality of film pairs, such as molybdenum-silicon (Mo/Si) film pairs (e.g., a layer of molybdenum above or below a layer of silicon in each film pair). Alternatively, the ML 86 may include molybdenum-beryllium (Mo/Be) film pairs, or any suitable material that is highly reflective at EUV wavelengths. The thickness of each layer of the ML 86 depends on the EUV wavelength and the incident angle. The thickness of the ML 86 is adjusted to achieve a maximum constructive interference of the EUV light reflected at each interface and a minimum absorption of the EUV light by the ML 86. The ML 86 may be selected such that it provides a high reflectivity to a selected radiation type and/or wavelength. In a typical example, the number of the film pairs in the ML 86 ranges from 20 to 80, however any number of film pairs is possible. In one example, the ML 86 includes forty pairs of layers of Mo/Si. In furtherance of the example, each Mo/Si film pair has a thickness of about 7 nm (a Mo film of about 3 nm thick and a Si film of about 3 nm thick), with a total thickness of 280 nm. In this case, a reflectivity of about 70% is achieved.

A capping layer may be formed above the ML 86 for one or more functions. In one example, the capping layer functions as an etch stop layer in a patterning process or other operations, such as repairing or cleaning. In another example, the capping layer functions to prevent oxidation of the ML 86. The capping layer may include one or more films to achieve the intended functions. In one example, the capping layer has different etching characteristics from a second reflective layer 88, which will be described later. In another example, the capping layer includes ruthenium (Ru). In furtherance of the example, the capping layer includes a Ru film with a thickness ranging from about 2 nm to about 5 nm. In other examples, the capping layer may include Ru compounds such as RuB, RuSi, chromium (Cr), Cr oxide, or Cr nitride. A low temperature deposition process may be chosen to form the capping layer to prevent inter-diffusion of the ML 86.

The mask 36 further includes the second reflective layer 88 formed above the first reflective layer (the ML layer) 86. The second reflective layer 88 is designed (such as by composition, configuration and thickness) to reflect the EUV light without absorption or lest absorption to avoid energy loss. The second reflective layer 88 is designed to further provide a phase shift to the reflected EUV light relative to the reflective EUV light from the first reflective layer 86. In the present embodiment, the phase difference of the reflected EUV lights from the first and second reflective layers is substantially 180° or close to 180° such that to achieve the enhanced exposure intensity during the lithography exposure process. Accordingly, the second reflective layer 88 functions as a phase shift and is a phase shift material layer.

The second reflective layer 88 is patterned according to an integrated circuit pattern having various main features 80. In one embodiment where the capping layer is present, the second reflective layer 88 is formed above the capping layer.

Thus, the mask 36 is a phase shift mask with two states, a first mask state and a second mask state. Both mask states substantially reflect the EUV light but with a phase difference (180° in the present embodiment). The first mask state is defined in the regions of the first reflective layer 86 within the openings of the second reflective layer 88, such as the main feature 80 being defined in the first mask state. The second mask state is defined in the regions of the second reflective layer 88, such as the field 82 being defined in the second mask state. Thus, the mask 36 is a binary phase mask or BPM. The IC pattern with low pattern density is defined below according to various embodiments. In the BPM 36, the first area S1 associated with the first mask state and the second area S2 associated with second mask state have a ratio in a certain range. In one embodiment, the ratio S1/S2 is less than about ⅓, such as the mask of the first type illustrated in FIG. 5A as one example. In an alternative embodiment, the ratio S1/S2 is greater than about 3, such as the mask of the second type illustrated in FIG. 5B as an example.

In a conventional binary intensity mask (BIM), the patterned layer is an absorption layer. Different from the BIM, the absorption layer is replaced by a phase shift material layer in the BPM.

FIG. 5A illustrates the mask 36 of the first type. The mask 36 of the second type is illustrated in FIG. 5B. The mask 36 inn FIG. 5B is similar to the mask 36 in FIG. 5A. Both include the first and second reflective layers 86 and 88. However, in FIG. 5B, the main feature 80 is defined in the second mask state and the field 82 is defined in the first mask state. Particularly, in FIG. 5B, the field 82 is defined in the region of the first reflective layer 86 within the opening of the second reflective layer 88 and the main feature 80 is defined within the second reflective layer 88. Since the first and second mask states are different from each other only in phase in ideal situation. This reverse tone mask may result the same image during the subsequent exposure process. In other situations where the first and second mask states may have different absorptions, the exposure process still can be tuned with illumination mode and the pupil filter to enhance the exposure intensity with reduced the energy loss.

The second reflective layer 88 may have various compositions and configurations according to various embodiments. The second reflective layer 88 may be different from the first reflective layer 86 in terms of composition and configuration in addition to that the second reflective layer 88 is patterned according to an IC layout.

In the present embodiment, the thickness of the second reflective layer 88 is less than that of the first reflective layer 86. Thus, the step height of the second reflective layer 88 after being patterned is reduced in order to eliminate or reduce the shadow effect. In a preferred embodiment, the second reflective layer 88 has a thickness less than 70 nm, in order to effectively reduce the shadow effect for IC with small feature sizes, such as feature size of 20 nm.

Figure 6:
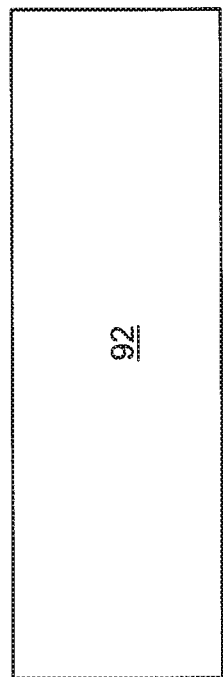

One embodiment of the second reflective layer 88 is illustrated in FIG. 6 in a sectional view. The second reflective layer 88 includes a single molybdenum (Mo) film 92 with a thickness ranging from about 40 nm to about 48 nm. The total thickness of the second reflective layer 88 is same to the thickness of the single Mo film 92 since the second reflective layer 88 includes only this Mo film. Thus designed second reflective layer 88 has a thickness less than about 50 nm, and furthermore is able to provide phase shift of about 180° and reflectivity of about 0.776 to the EUV radiation. Stated differently, the designed second reflective layer 88 provides reflectivity of about −0.776 where the sign "−" stands for 180° phase shift. Accordingly, the reflected EUV intensity is about 60% and the energy loss is about 40%.

Figure 7:
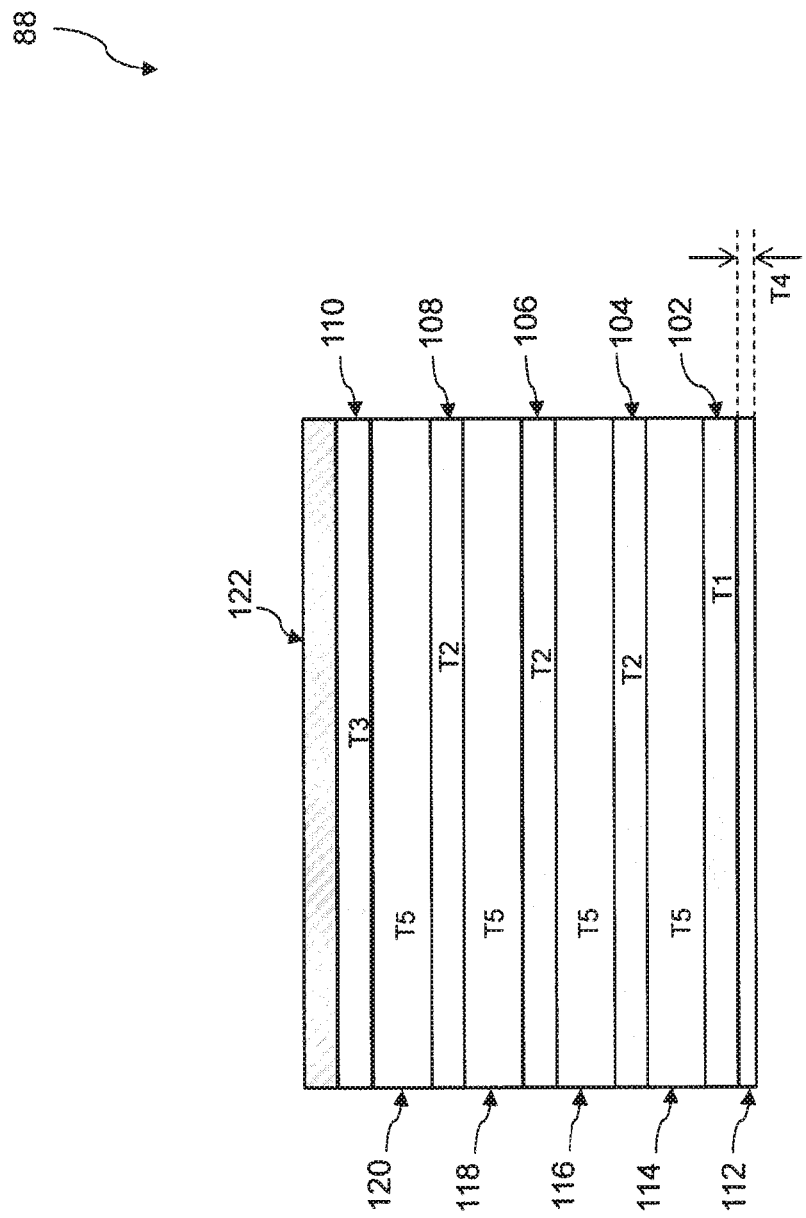

Another embodiment of the second reflective layer 88 is illustrated in FIG. 7 in a sectional view. The second reflective layer 88 includes multiple films. Particularly, the second reflective layer 88 includes five silicon films 102, 104, 106, 108 and 110; and five Mo films 112, 114, 116, 118 and 120 configured such that two adjacent Mo films sandwich a silicon film and two adjacent silicon film sandwich a Mo film. The second reflective layer 88 may further include a capping layer 122 disposed on the top silicon film 110. In the present embodiment, the silicon film 102 has a first thickness T1, the silicon films 104, 106 and 108 have a same second thickness T2 greater than the first thickness T1 and the silicon Mo film 110 has a third thickness T3 less than the first thickness T1. In the present embodiment, the Mo layer 112 has a fourth thickness T4 less than the third thickness T3, and the Mo films 114, 116, 118 and 120 have a same fifth thickness T5 greater than the second thickness T2. Those films are tuned collectively to have a thickness less than 70 nm, phase shift of about 180°, and a reflectivity to the EUV radiation such that the energy loss is less than about 40%.

In the present example, the thickness parameters T1, T2, T3, T4 and T5 are about 4 nm, about 4.3 nm, about 2.6 nm, about 1 nm and about 10.1 nm, respectively, each being within about 20% of the nominal value. For example, the first thickness T1 ranges from about 4× (1+20%) nm to about 4× (1−20%) nm.

The capping layer 122 may be similar to the capping layer described above in FIG. 5A. In one embodiment, the capping layer 122 includes a Ru film. In furtherance of the embodiment, the capping layer 122 includes a Ru film with a thickness ranging between about 2 nm and about 5 nm. In other examples, the capping layer 122 may include Ru compounds such as ruthenium boron (RuB), ruthenium silicon (RuSi), chromium (Cr), Cr oxide, or Cr nitride.

In the present example, the reflectivity of the second reflective layer 88 is about 0.867 or about −0.867 where the sign "−" stands for 180° phase shift. Accordingly, the reflected radiation energy intensity is about 75% and the radiation energy loss is about 25%.

Another embodiment of the second reflective layer 88 is illustrated in FIG. 8. In this embodiment, the second reflective layer 88 is substantially similar to the first reflective layer 86 in terms of composition and configuration. The second reflective layer 88 also includes a multiple reflective layer similar to that of the first reflective layer 86. For example, the second reflective layer 88 includes a plurality of film pairs ("m1" and "m2"), such as Mo/Si film pairs (e.g., a layer of molybdenum above or below a layer of silicon in each film pair). In the present embodiment, the second reflective layer 88 includes about 15 pairs of Mo/Si film to achieving 180° phase shift. In other examples, the second reflective layer 88 alternatively include molybdenum-beryllium (Mo/Be) film pairs, or any suitable material that is highly reflective at EUV wavelengths. The thickness of each layer of the second reflective layer 88 depends on the EUV wavelength and the incident angle.

Each of the layers (such as films 102-122 in FIG. 7) may be formed by various methods, including physical vapor deposition (PVD) process, a plating process, a chemical vapor deposition (CVD) process, ion beam deposition, spin-on coating, metal-organic decomposition (MOD), and/or other methods known in the art.

The second reflective layer 88 may be patterned by a suitable patterning technique. A patterning process may include resist coating (e.g., spin-on coating), soft baking, mask aligning, exposure, post-exposure baking, developing the resist, rinsing, drying (e.g., hard baking), other suitable processes, and/or combinations thereof. An etching process is followed to remove a portion of the patterned reflective layer 88.

The mask 36 includes two mask states, 80 and 82. The mask 36 also includes a conductive layer 126 disposed on back surface of the mask substrate 84 for the electrostatic chucking purpose. In one example, the conductive layer 126 includes chromium nitride (CrN), though other compositions are possible. The mask 36 further includes a capping layer 128 formed between the first and second reflective layers 86 and 88. The capping layer 128 may include one or more films. In one example, the capping layer 128 has different etching characteristics from a second reflective layer 88. In another example, the capping layer 128 includes Ru. In furtherance of the example, the capping layer 128 includes a Ru film with a thickness ranging from about 2 to about 5 nm. In other examples, the capping layer 128 may include Ru compounds such as RuB, RuSi, chromium (Cr), Cr oxide, or Cr nitride.

Referring back to FIG. 1, the operation 12 in the method 10 may further include other steps, such as alignment after the mask 36 is secured on the mask stage.

Still referring to FIG. 1, the method 10 also includes an operation 14 to load a target 40 to the substrate stage 42 of the lithography system 30. In the present embodiment, the target 40 is a semiconductor substrate, such as a silicon wafer. The target 40 is coated with a resist layer that is sensitive to the EUV light. The resist layer is to be patterned by a lithography exposure process such that the IC design layout (IC pattern) of the mask 36 is transferred to the resist layer.

Figure 3:
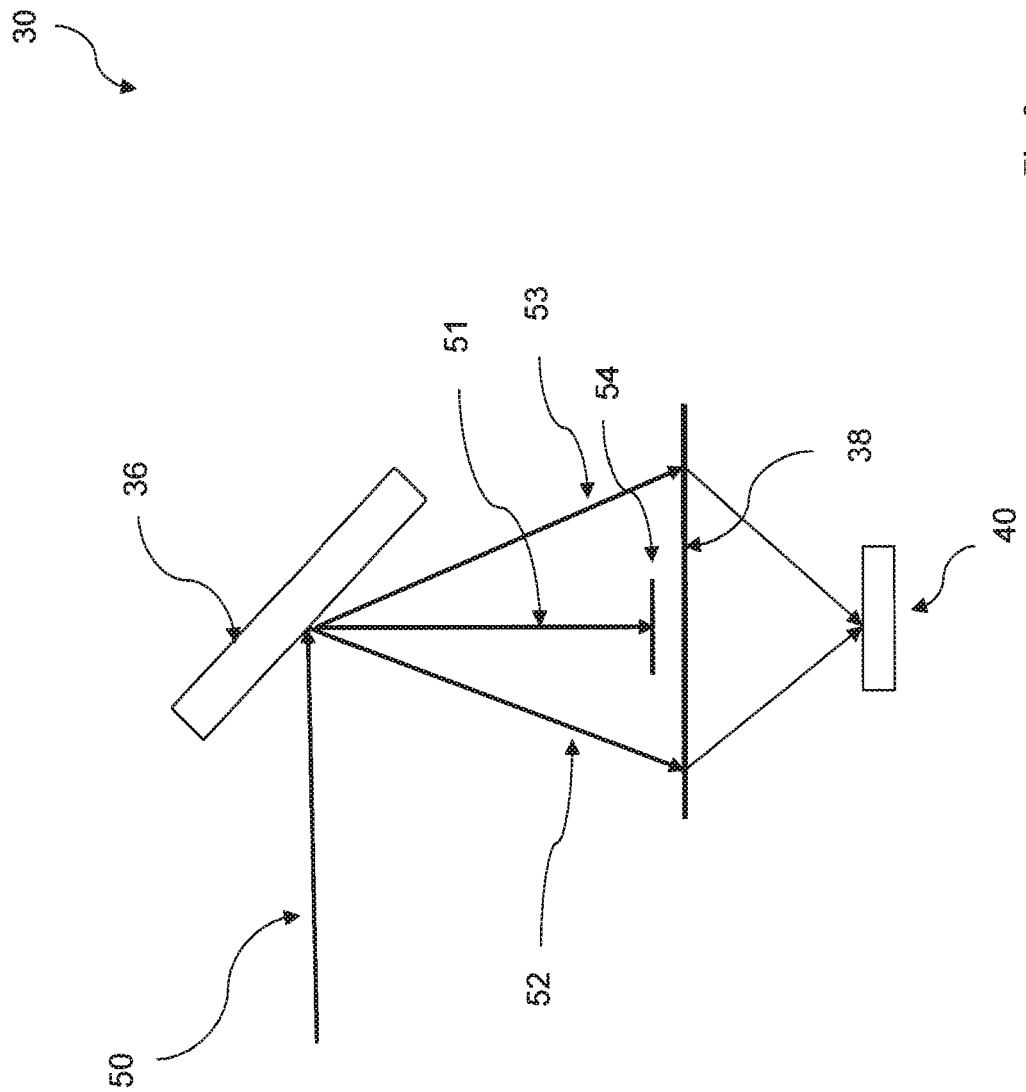
FIG. 3 is a diagrammatic perspective view of the lithography system constructed according to one embodiment.

Referring to FIG. 1, the method 10 includes an operation 16 by setting the illuminator 34 of the lithography system 30 in a highly coherent illumination mode. The illumination mode is configured such that the fill pupil ratio is less than 20% in one example. In the present embodiment, an off-axis illumination (OAI) mode is achieved. Referring to FIG. 3, an incident light ray 50, after being reflected from the mask 36, is diffracted into various diffraction orders due to presence of these mask patterns, such as a 0-th diffraction order ray 51, a −1-st diffraction order ray 52 and a +1-st diffraction order ray 53. In the depicted embodiment, the non-diffracted light rays 51 are mostly removed. The −1-st and +1-st diffraction order rays, 52 and 53, are collected by the POB 38 and directed to expose the target 40.

The off-axis illumination mode may be achieved by a mechanism, like an aperture with a certain pattern, such as those illustrated in FIGS. 10A-10C, constructed according to various examples. The aperture is configured at the illuminator stage to achieve the off-axis illumination mode. However, the aperture causes the EUV radiation loss.

In the present embodiment, the illuminator 34 includes various switchable mirrors or mirrors with other suitable mechanism to tune the reflections of the EUV light from those mirrors. In furtherance of the present embodiment, the off-axis illumination mode is achieved by configuring the switchable mirrors in the illumination stage such as the EUV light from the radiation source 32 is directed into a pattern (such as those shown in FIGS. 9A-9C) to achieve the off-axis illumination.

The illumination mode may include different patterns, such as those examples in FIGS. 9A-9C. The illumination pattern is determined according to the IC pattern defined on the mask 36 for the expected purpose that includes enhancing the intensity of the EUV light during the lithography exposure process.

In FIG. 9A, the illumination mode has an annular pattern 130 where the annular portion 130 is the region being transparent (or in "on" state) to the light from the radiation source 32 and the other portions are in "off" state (blocking). The "on" region means that when the light reaches the region it will be directed to the mask 36. The "off" region means that when the light reaches the region it will be blocked from reaching the mask 36. Those terms are also used to describe the pupil filter. For the present example in FIG. 9A, the EUV light reaching the annular portion 130 will be directed to the mask 36 while the EUV light reaching the "off" portions will be blocked.

In FIG. 9B, the illumination mode has a quasar pattern 132 where the quasar portions 132 are in "on" state and the rest portions are in "off" state. In other words, the EUV light reaching the quasar portions 132 will be directed to the mask 36 while the EUV light reaching the rest portions will be blocked.

In FIG. 9C, the illumination mode has a scattering pattern 134. The EUV light directed to the scattering portions 134 will be directed to the mask 36 while the EUV light to the rest portions will be blocked.

Referring to FIG. 1, the method 10 may include an operation 18 by configuring a pupil filter 54 in the lithography system 30. The pupil filter 54 is configured in a pupil plane of the lithography system 30. In an image optical system, there is a plane with field distribution corresponding to Fourier Transform of object (the mask 36 in the present case). This plane is called pupil plane. The pupil filter 54 is placed in the pupil plane to filter out specific spatial frequency components of the EUV light directed from the mask 36.

The pattern defined in the pupil filter 54 is determined by the illumination mode. In the present embodiment, the pupil filter 54 is designed to filter out the non-diffracted portion of the illuminated light directed from the mask 36. In furtherance of the present embodiment, the pupil filter 54 matches the illumination mode but is complimentary. In furtherance of the embodiment, the pattern in the pupil filter 54 is substantially similar to the pattern of the illumination mode. For example, when the illumination mode is defined as the annular pattern in FIG. 9A, the pattern of the pupil filter 54 is also the same annular pattern 136 illustrated in FIG. 10A. However, the pattern of the pupil filter in FIG. 10A is complimentary to the pattern defined in the illumination mode in FIG. 9A. Particularly, the annular portion 136 is in the "off" state where the EUV light reaches this portion in the pupil plane will be blocked. The EUV light reaches to other portion in the pupil plane will be directed to the target 40 ("on" state). Similarly, when the illumination mode is defined in FIG. 9B, the corresponding pupil filter will have a pattern illustrated in FIG. 10B, wherein the quasar portions 138 are in "off" state while the other portions are in the "on" state. In another example, when the illumination mode is defined in FIG. 9C, the corresponding pupil filter will have a pattern illustrated in FIG. 10C, wherein the scattering portions 140 are in "off" state while the other portions are in the "on" state.

In another embodiment, the pupil filter may have a pattern slightly different from the pattern defined in the illumination mode. For example, the pupil filter has an "off" pattern larger than the "on" pattern of the corresponding illumination mode such that the corresponding "on" region in the illumination mode is covered with an enough margin. Other illumination modes and the corresponding pupil filters may be used according to other examples.

Figure 11B:
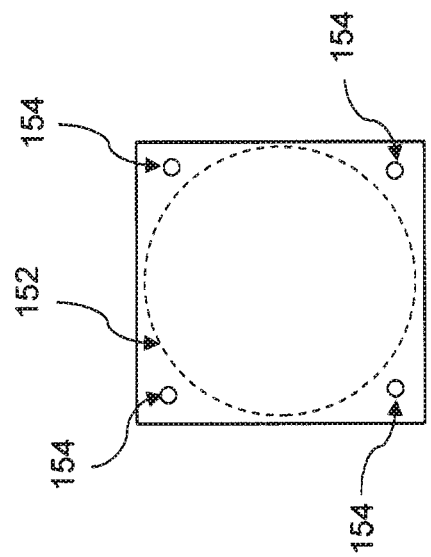
FIGS. 11A and 11B are diagrammatic top views of a pupil filter used in the lithography system of FIG. 3, constructed according to other embodiments.
Figure 11A:
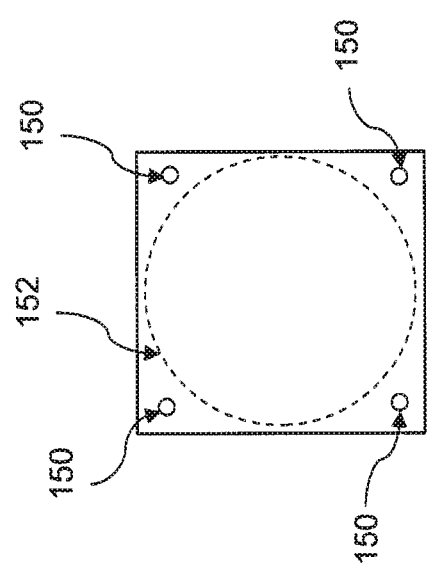

In yet another embodiment, where the illuminator source is out of pupil or partial coherence sigma is >1, the pupil filter is eliminated. As one example illustrated in FIG. 11A, the "on" regions 150 in the illumination mode are illustrated. The full pupil 152 in the pupil plane is illustrated in FIG. 11A in the region within the dashed line for reference. The "on" region 150 in the illumination mode is out of the full pupil 152. In this case, the sigma center is greater than 1. In this particular example, the sigma center is 1.2 and sigma radius is 0.05. There is no need to utilize a pupil filter in the pupil plane. Another example is illustrated in FIG. 11B, where the "on" region 154 is out of the full pupil 152. In this case, the sigma center is 1.15 greater than 1 and sigma radius is 0.05. As a result, there is no need to utilize the pupil filter in the pupil plane.

Referring back to FIG. 1, the method 10 proceeds to operation 20 by performing a lithography exposure process to the target 40 in the configured illumination mode and the pupil filter (in the cases where the pupil filter is needed). The EUV light from the radiation source 32 is modulated by the illuminator 34 with the EUV energy distribution for the off-axis illumination, directed from the mask 36, and further filtered by the pupil filter, the EUV light images the IC pattern of the mask 36 to the target with enhanced light.

Figure 13:
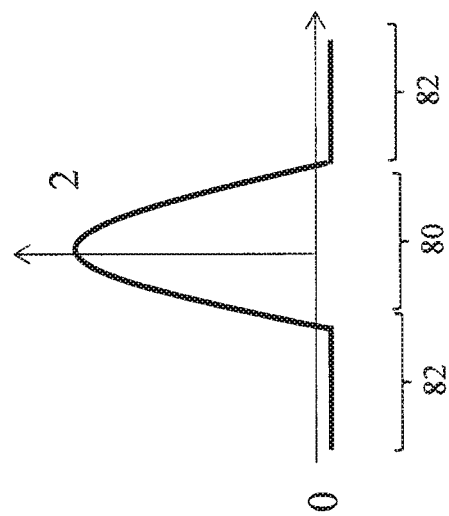
FIG. 13 illustrates the exposure light field distribution after the pupil filter constructed according to aspects of the present disclosure in one embodiment.
Figure 12:
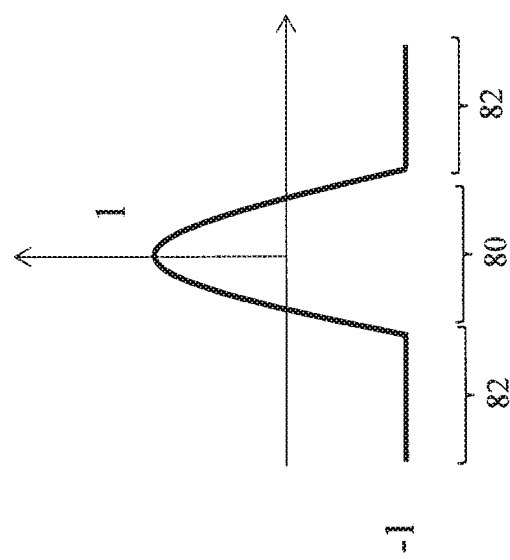
FIG. 12 illustrates the exposure light field distribution before the pupil filter constructed according to aspects of the present disclosure in one embodiment.

This is illustrated and described below with reference to FIGS. 12-13 and other figures. FIGS. 12 and 13 are diagrammatical view of the spatial distribution of EUV light. The horizontal axis represents spatial dimension and the vertical axis represents the amplitude of the EUV light. In the present embodiment for the illustration, the mask pattern is the IC pattern defined in FIG. 4. The main feature is 80 in the first mask state and the field 82 is in the second mask state. Accordingly, the EUV light distribution after directed from the mask 36 is illustrated in FIG. 12. The light amplitude corresponding to the first mask state (the main feature 80) is about 1 (in a relative unit assuming the full amplitude before reaching the mask is 1). This means the EUV light associated with the main feature 80 is fully reflected without energy loss and the phase is 0. In contrast, the light amplitude corresponding to the second mask state (the field 82) is about −1 (in the relative unit). This means the EUV light associated with the field 82 is fully reflected without energy loss and the phase is 180° relative to that of the main feature.

The EUV light from the mask 36 is further filtered by the pupil filter in the pupil plane such that a portion of the EUV light with a certain spatial frequency is filtered out. In the present embodiment, the non-diffracted component of the EUV light is filtered out. In one example, the EUV component of the $0^{th}$ spatial frequency is filtered out. The EUV light spatial distribution after the pupil filter is illustrated in FIG. 13. The light amplitude corresponding to the first mask state (the main feature 80) is about 2 and the light amplitude corresponding to the second mask state (the field 82) is about 0. Therefore, the amplitude of the EUV light corresponding to the first mask state is about doubled. Accordingly, the intensity of the EUV light corresponding to the first mask state is about four times greater. This is achieved by the designed illumination mode and the structure of the mask 36 (and additionally contributed by the corresponding pupil filter). In other embodiment, the first and second mask states may experience certain energy loss due to the absorption, and the overall EUV intensity is still substantially enhance, such as about 3 times greater than the original EUV intensity.

Figure 16:
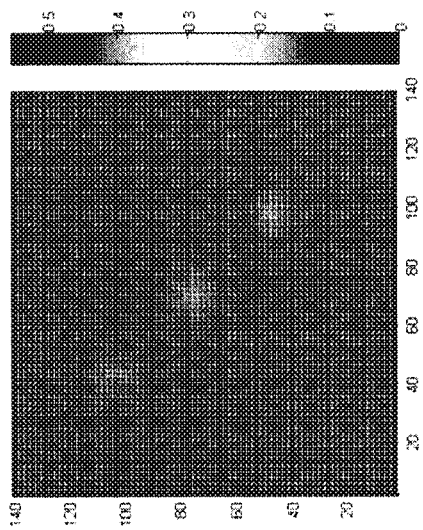
FIG. 16 is a schematic view of an image of the IC pattern of FIG. 14 on the target using the BIM, constructed according to one embodiment.
Figure 14:
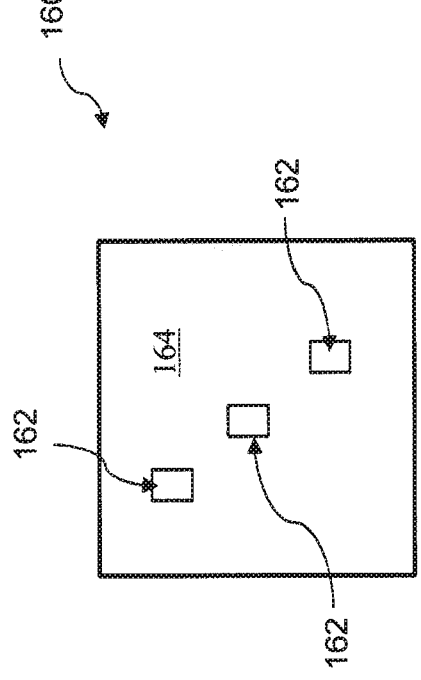
FIG. 14 is a schematic view of an integrated circuit (IC) pattern constructed according to aspects of the present disclosure in one embodiment.
Figure 15:
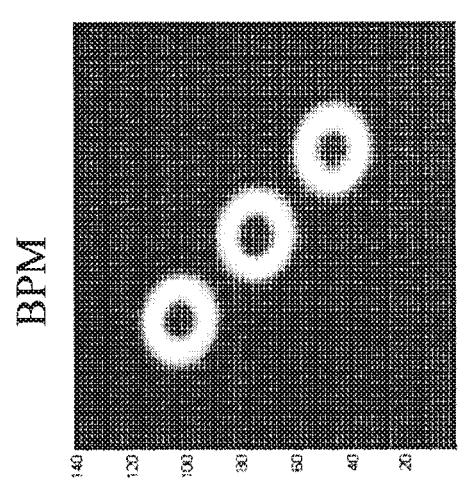
FIG. 15 is a schematic view of an image of the IC pattern of FIG. 14 on the target using the BPM, constructed according to aspects of the present disclosure in one embodiment.

One real example is further illustrated in FIGS. 14-16. FIG. 14 illustrates an IC pattern 160. The IC pattern 160 includes various main features 162 (three exemplary main features in this example) and the field 164. By implementing the method 10 with the mask 36, the image of the IC pattern on the target 40, illustrated in FIG. 15, is achieved with high intensity. In this case, the IC pattern is defined on the BPM 36. In the present embodiment, the main features 162 are defined in one of the first and second mask states. The field 164 is defined in another mask state.

As a comparison, when the IC pattern is defined in a conventional mask, such as a binary intensity mask, the corresponding image of the IC pattern on the target, as illustrated in FIG. 16, has a low intensity. Other benefits of the method 10 includes reduced mask error enhancement factor (MEEF) and reduced printability of particles on the mask. The MEEF reduction is further described according to different examples.

Figure 17:
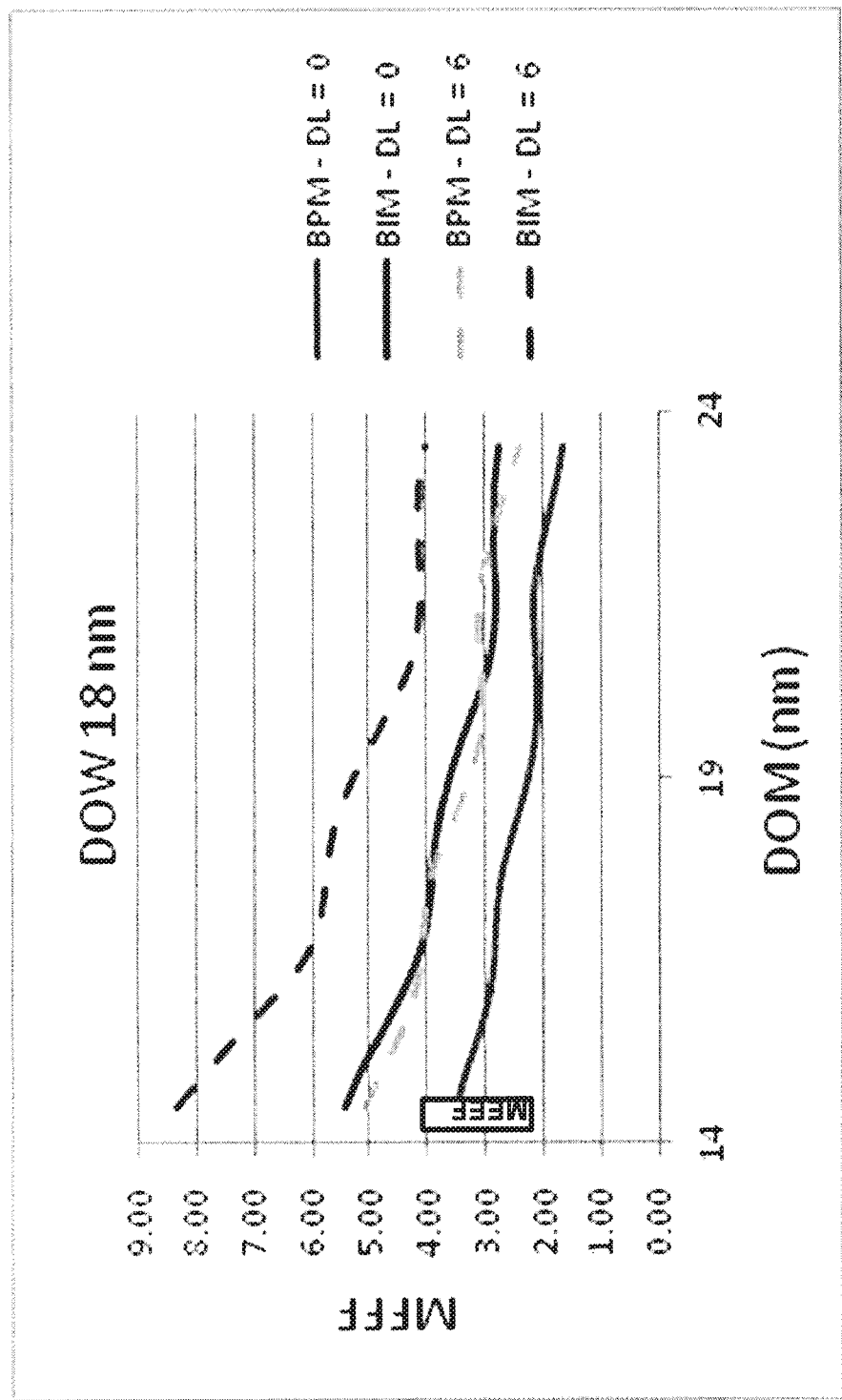
FIG. 17 illustrates diagrammatically the mask error enhancement factor (MEEF) over the dimension on mask (DOM), constructed according to various embodiments.

FIG. 17 illustrates diagrammatically the MEEF for various methods. MEEF is defined as $M^*(\Delta CD_w)/(\Delta CD_m)$, where $\Delta CD_w$ is the CD change of a feature in wafer and $\Delta CD_m$ is the CD change of the feature in the mask. The horizontal axis represents dimension on mask (DOM) in nanometer (nm). The vertical axis represents MEEF. The dimension on wafer (DOW) is about 18 nm in the present example. FIG. 17 includes four curves. The first curve represents the data from the lithography exposure process using the mask 36 (BPM) with photoresist diffusion length (DL)=0 nm corresponding to ideal resist, labeled in the legend as "BPM-DL=0". The second curve represents the data from the lithography exposure process using a binary intensity mask with DL=0 nm, labeled in the legend as "BIM-DL=0". The third curve represents the data from the lithography exposure process using the mask 36 with DL=6 nm, labeled in the legend as "BPM-DL=6". The fourth curve represents the data from the lithography exposure process using a binary intensity mask with DL=6 nm, labeled in the legend as "BIM-DL=6". FIG. 17 clearly demonstrates that the MEEF is substantially reduced by utilizing the method 10 with the mask 36.

Figure 18:
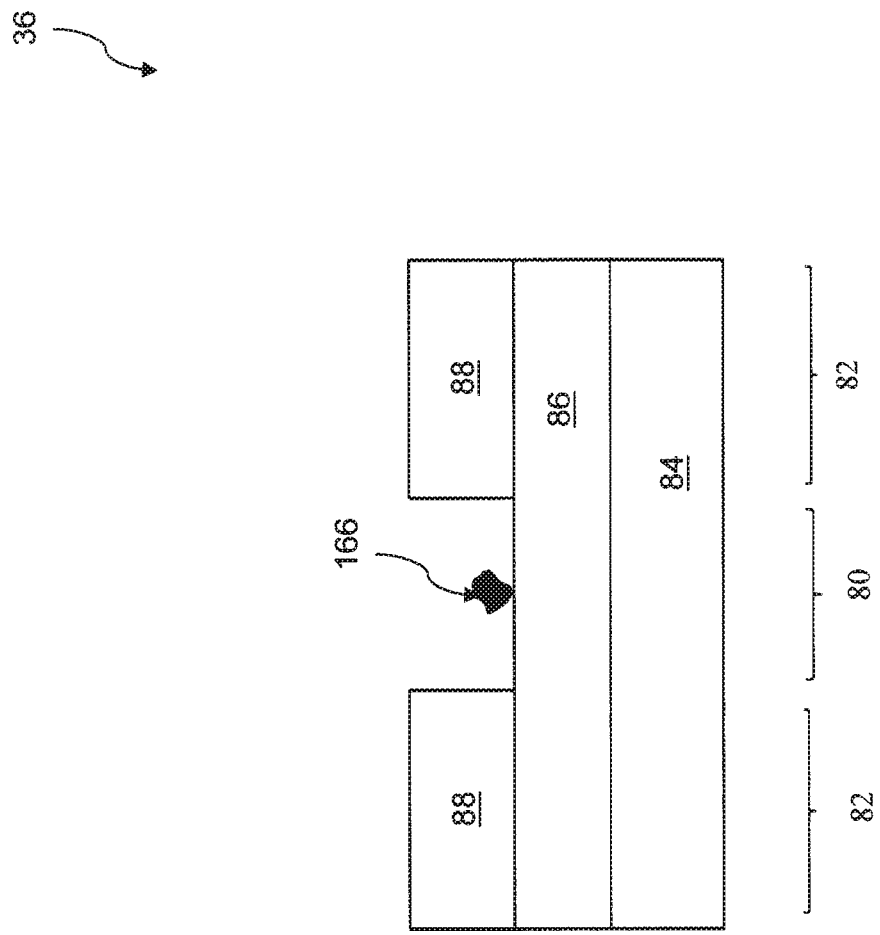
FIG. 18 is a diagrammatic cross-sectional view of the binary phase mask with an exemplary particle constructed according to aspects of the present disclosure in one embodiment.

FIG. 18 illustrates the mask 36 that is the same mask illustrated in FIG. 5A. However, there is an exemplary particle 166 falling on the mask 36 in FIG. 18. According to the similar analysis in FIGS. 12 and 13, the EUV light distribution in amplitude before the pupil filter is similar to the one in FIG. 12 but the region corresponding to the particle completely lost the EUV light or the corresponding amplitude is 0. After the pupil filter, the EUV light distribution in amplitude is similar to the one in FIG. 13 but the region corresponding to the particle has the amplitude as 1. Accordingly, the EUV intensity to the field is 0, to the main feature 4 and to the particle is 1. The relative EUV intensity to the particle 166 is non-zero, which is different from the intensity to the field. The printability of the particle is reduced.

In contrast, the particle falling on the main feature in a binary intensity mask will cause the total loss of the EUV light reaching thereto, resulting in an unexposed region as a defect.

Referring back FIG. 1, the method 10 may further include other operations. For example, the method 10 includes an operation 22 by developing the exposed resist layer coated on the target 40, thereby forming a patterned resist layer with one or more openings imaged from the IC pattern defined on the mask 36.

In another example, the method 10 further includes an operation 24 by performing a fabrication process to the target 40 through the patterned resist layer. In one embodiment, the substrate or a material layer of the target is etched through the openings of the patterned resist layer, thereby transferring the IC pattern to the substrate or the underlying material layer. In furtherance of the embodiment, the underlying material layer is an interlayer dielectric (ILD) layer disposed on the semiconductor substrate. The etching process will form contacts or vias in the corresponding ILD layer. In another embodiment, an ion implantation process is applied to the semiconductor substrate through the openings of the patterned resist layer, thereby forming doped features in the semiconductor substrate according to the IC pattern. In this case, the patterned resists layer functions as an ion implantation mask.

Various embodiments of the method 10 and the mask 36 are described according to the present disclosure. Other alternatives and modifications may present without departure from the spirit of the present disclosure. In one embodiment, the IC pattern defined on the mask 36 may further include various assist polygons incorporated by an OPC process. In one example, the assist polygons are assigned to a same state. For example, the assist polygons are assigned to the first mask state. In another embodiment, the binary phase mask 36 may have other structure to achieve the same functions, such as enhancing the exposure intensity by the method 10. In various examples, the resist material is assumed as a positive tone resist and the main features achieve the high exposure intensity. However, in one embodiment, the resist layer may be a negative tone resist.

As described above in various embodiments, the present disclosure provides a method for extreme ultraviolet lithography (EUVL) exposure process to pattern an IC pattern, especially an IC pattern with a low pattern density, with enhanced intensity by using a binary phase mask, off-axis illumination mode and corresponding pupil filter. Especially, the illumination mode is determined by the IC pattern defined on the binary phase mask and the pattern of the pupil filter is determined according to the illumination mode. In one embodiment, the illuminator includes a plurality of mirrors configured to generate the illumination mode. The pupil filter is configured in the pupil plane of the lithography system and is designed to filter out a portion of the EUV light with a certain spatial frequency. In the present example, the non-diffracted component of the EUV light is filtered out. In another embodiment, the pupil filter may be eliminated during the lithography exposure process when the sigma center in the illumination mode is greater than 1.

Various advantages may present in different embodiments of the present disclosure. In one example, the exposure intensity is enhanced. Accordingly, the exposure duration is reduced and the throughput is increased, especially for the IC pattern with a low pattern density. By utilizing the highly coherent illumination mode and corresponding pupil filtering, the energy loss is substantially reduced. In one example for illustration, the pupil fill ratio (the relative energy loss by the pupil filter) is much less, such as less than about 20%. The exposure light amplitude to the main features is substantially increased and the MEEF is reduced. In another example, the printability of the falling particles is mitigated.

Thus, the present disclosure provides a method for extreme ultraviolet lithography (EUVL) process in some embodiments. The method includes loading a binary phase mask (BPM) to a lithography system, wherein the BPM includes two phase states and defines an integrated circuit (IC) pattern thereon; setting an illuminator of the lithography system in an illumination mode according to the IC pattern; configuring a pupil filter in the lithography system according to the illumination mode; and performing a lithography exposure process to a target with the BPM and the pupil filter by the lithography system in the illumination mode.

The present disclosure also provides a method for EUVL process in other embodiments. The method includes loading a binary phase mask (BPM) to a lithography system, wherein the BPM includes two phase states and defines an integrated circuit (IC) pattern thereon; setting an illuminator of the lithography system in a highly coherent illumination mode according to the IC pattern; and performing a lithography exposure process to a resist layer coated on a target with the BPM and the illuminator in the illumination mode.

The present disclosure also provides a method for EUVL process in one or more embodiments. The method includes loading a binary phase mask (BPM) to a lithography system, wherein the BPM includes two phase states and defines an integrated circuit (IC) pattern with a pattern density less than 25%; setting switchable mirrors in an illuminator of the lithography system in an illumination mode; configuring a pupil filter in a pupil plane of the lithography system, wherein the pupil filter has a pattern determined according to the illumination mode; and performing a lithography exposure process to a target with the BPM and the pupil filter by the lithography system in the coherent illumination mode.

Another embodiment of the present disclosure is described below with reference to FIGS. 19-22.

Figure 19:
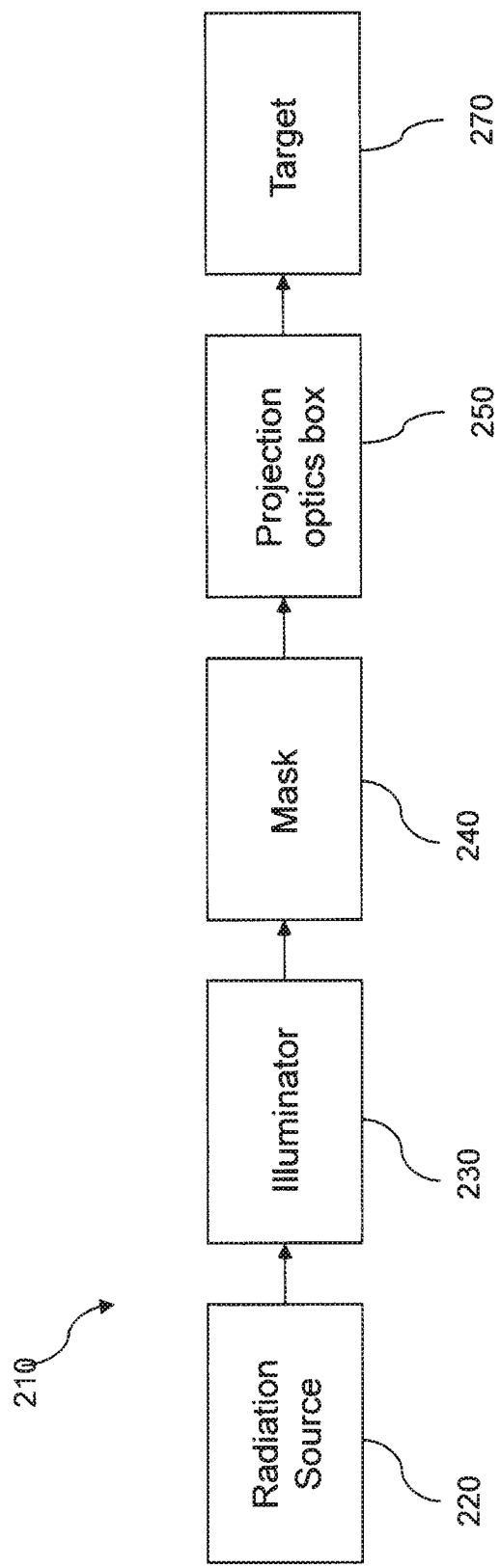
FIG. 19 is a block diagram of a lithography process for implementing one or more embodiments of the present invention.

Referring to FIG. 19, an EUVL process 210 that may benefit from one or more embodiments of the present invention is disclosed. The EUVL process 210 employs an EUV source 220 that emits radiation having a wavelength $\lambda$ of about 1-100 nm, including an EUV wavelength of about 13.5 nm.

The EUVL process 210 also employs an illuminator 230. The illuminator 230 may comprise refractive optics, such as a single lens or a lens system having multiple lenses (zone plates) and/or reflective optics, such as a single mirror or a mirror system having multiple mirrors in order to direct light from the radiation source 220 onto a mask 240. In the EUV wavelength range, reflective optics is employed generally. Refractive optics, however, can also be realized by zone-plates. In the present embodiment, the illuminator 230 is set up to provide a nearly on-axis illumination to illuminate the mask 240. In nearly on-axis illumination, all incoming light rays incident on the mask are at the same angle of incidence (AOI), e.g., AOI=6°, as that of a chief ray. In many situations, there may be some angular spread of the incident light. For example, the EUVL process 210 may utilize disk illumination (i.e., the shape of the illumination on the pupil plane is like a disk centered at the pupil center). When illumination of a partial coherence $\sigma$, e.g., $\sigma$=0.3, is employed, the maximum angular deviation from the chief ray is $\sin^{-1}[m \times \sigma \times NA]$, where m and NA are the magnification and numerical aperture, respectively, of the projection optics box (POB) 250 to be detailed below. Partial coherence $\sigma$ can also be used to describe a point source which produces a plane wave for illuminating the mask 240. In this case, the distance from the pupil center to the point source in the pupil plane is NA×$\sigma$ and the AOI of the corresponding plane wave incident on the mask 240 is $\sin^{-1}[m \times \sigma \times NA]$. In the present embodiment, it is sufficient to employ a nearly on-axis illumination consisting of point sources with σ less than 0.3.

The EUVL process 210 also employs a mask 240 (in the present disclosure, the terms mask, photomask, and reticle are used to refer to the same item). The mask 240 can be a transmissive mask or a reflective mask. In the present embodiment, the mask 240 is a reflective mask such as described in further detail below. The mask 240 may incorporate other resolution enhancement techniques such as phase-shifting mask (PSM) and/or optical proximity correction (OPC).

The EUVL process 210 also employs a projection optics box (POB) 250. The POB 250 may have refractive optics or reflective optics. The radiation reflected from the mask 240 (e.g., a patterned radiation) is collected by the POB 250. The POB 250 also includes a pupil filter placed at an optics pupil plane to modulate phase and amplitude of radiation reflected from the mask 240.

Figure 20:
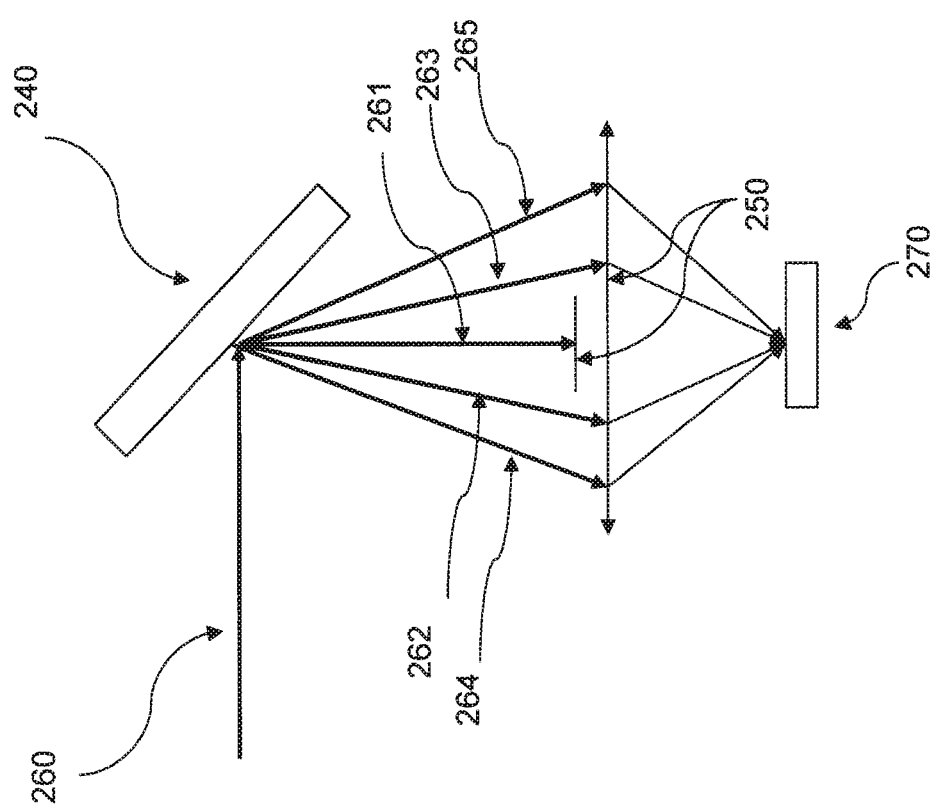
FIG. 20 is a diagrammatic perspective view of a projection optics box (POB) employed in the lithography process for implementing one or more embodiments of the present invention. Since a POB by reflective optics is difficult to sketch, the equivalent refractive optics is used to illustrate the underlying principle.

Referring to FIG. 20, an incident light ray 260, after being reflected from the mask 240, is diffracted into various diffraction orders due to the presence of mask patterns, such as a 0-th diffraction order ray 261, a −1-st diffraction order ray 262 and a +1-st diffraction order ray 263 and other higher diffraction order rays (represented by 264 and 265). For lithographic imaging, purely coherent illumination is generally not employed. Disk illumination with partial coherence σ being at most 0.3 generated by the illuminator 230 is employed. In the depicted embodiment, the non-diffracted light rays 261 are mostly (e.g., more than 70%) removed by the pupil filter in the POB 250. The −1-st and +1-st diffraction order rays, 262 and 263, and other higher diffraction order rays (264 and 265) are collected by the POB 250 and directed to expose a target 270. Removing the non-diffracted light amounts to subtracting the average electric field from the total electric field on the target 270. For a mask with a layout of low pattern density, the average electric field is close to the reflection coefficient of the field of the mask, i.e., the region without polygons. Therefore, for a mask with a layout of low pattern density, removing the non-diffracted light greatly enhances the image log slope of the aerial image formed on the target 270, since the phase difference of electric fields on pattern regions and on the field region is close to 180 degrees.

The target 270 includes a semiconductor wafer with a photosensitive layer (e.g., photoresist or resist), which is sensitive to the EUV radiation. The target 270 may be held by a target substrate stage. The target substrate stage provides control of the target substrate position such that the image of the mask is scanned onto the target substrate in a repetitive fashion (though other lithography methods are possible).

The following description refers to the mask 240 and a mask fabrication process. The mask fabrication process includes two steps: a mask blank fabrication process and a mask patterning process. During the mask blank fabrication process, a mask blank is formed by depositing suitable layers on a suitable substrate. The mask blank is patterned during the mask patterning process to have a design of a layer of an integrated circuit (IC) device (or chip). The patterned mask is then used to transfer circuit patterns (e.g., the design of a layer of an IC device) onto a semiconductor wafer. The patterns can be transferred over and over onto multiple wafers through various lithography processes. Several masks (for example, a set of 15 to 30 masks) may be used to construct a complete IC device.

Figure 21:
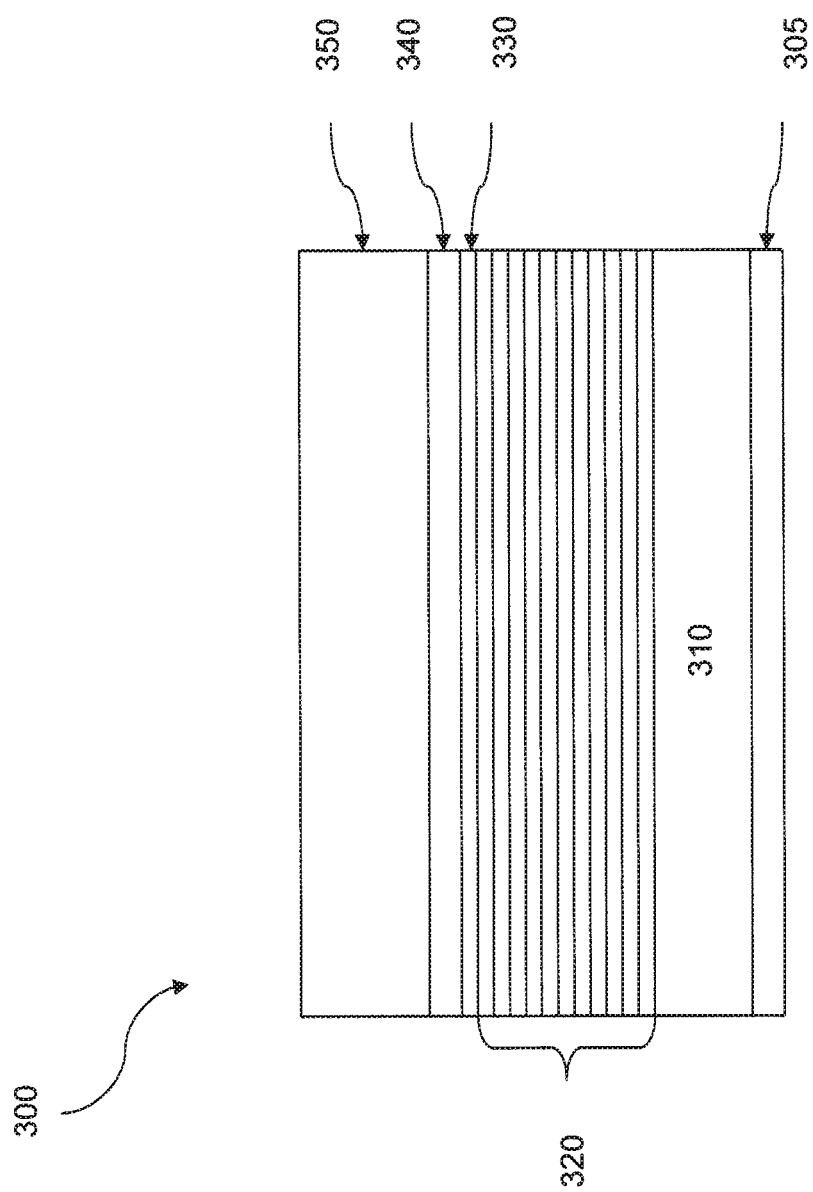
FIG. 21 is a diagrammatic cross-sectional view of various aspects of one embodiment of a mask blank at various stages of a lithography process constructed according to aspects of the present disclosure.

Referring to FIG. 21, a mask blank 300 comprises a substrate 310 made of low thermal expansion material (LTEM). The LTEM material may include $TiO_2$ doped $SiO_2$, and/or other low thermal expansion materials known in the art. The LTEM substrate 310 serves to minimize image distortion due to mask heating. In the present embodiment, the LTEM substrate includes materials with a low defect level and a smooth surface. In addition, a conductive layer 305 may be deposed under (as shown in the figure) the LTEM substrate 310 for the electrostatic chucking purpose. In an embodiment, the conductive layer 305 includes chromium nitride (CrN), though other compositions are possible.

The mask blank 300 includes a reflective multilayer (ML) 320 deposited over the LTEM substrate 310. According to Fresnel equations, an incident light ray will be partially reflected when it propagates across the interface between two materials of different refractive indices. The reflected light ray is larger when the difference of the refractive indices is larger. To increase the reflected light ray, one may also increase the number of interfaces by depositing a ML of alternating materials, and then choose an appropriate thickness for each layer of the ML according to the wavelength and the angle of incidence of the incident light ray so that reflected light rays from different interfaces interfere constructively. However, the absorption of the employed materials for the ML limits the highest reflectivity that can be achieved. In one embodiment, the reflective ML 320 includes molybdenum-silicon (Mo/Si) film pairs (i.e., a layer of molybdenum over a layer of silicon in each film pair). In another embodiment, the reflective ML 320 includes molybdenum-beryllium (Mo/Be) film pairs. In still another embodiment, the reflective ML 320 includes forty Mo/Si film pairs with each Mo/Si film pair consisting of 3-nm Mo and 4-nm Si. In this case, a reflectivity of about 70% is achieved.

The mask blank 300 may also include a capping layer 330 over the reflective ML 320 to prevent oxidation of the reflective ML 320. In one embodiment, the capping layer 330 includes silicon with about 4-7 nm thickness.

The mask blank 300 may also include a buffer layer 340 over the capping layer 330 to act as an etching stop layer in a patterning or repairing process of an absorption layer, which will be described later. The buffer layer 340 has different etching characteristics from the absorption layer. The buffer layer 340 includes ruthenium (Ru), Ru compounds such as RuB, RuSi, chromium (Cr), Cr oxide, and Cr nitride. A low temperature deposition process is often chosen for the buffer layer to prevent inter-diffusion of the reflective ML 320. In the present embodiment, the buffer layer 340 includes ruthenium with a thickness from 2 nm to 5 nm. In one embodiment, the capping layer and the buffer layer are a single layer.

In the present embodiment, the mask blank 300 includes a phase-shifting layer 350 over the buffer layer 340. The phase-shifting layer 350 includes material or materials whose thickness or thicknesses is or are properly chosen to achieve an about 180-degree phase shift for a light ray reflected from this region (relative to the region without the phase-shifting layer). In one embodiment, the phase-shifting layer 350 includes molybdenum (Mo) having a thickness from 40 nm to 48 nm. The phase-shifting layer 350 may also be formed by multiple layers of different materials.

One or more of the layers 305, 320, 330, 340 and 350 may be formed by various methods, including physical vapor deposition (PVD) process such as evaporation and DC magnetron sputtering, a plating process such as electrodeless plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods known in the art. The MOD is a deposition technique by using a liquid-based method in a non-vacuum environment. By using MOD, a metal-organic precursor, dissolved in a solvent, is spin-coated onto a substrate and the solvent is evaporated. A vacuum ultraviolet (VUV) source is used to convert the metal-organic precursors to constituent metal elements.

Referring to FIG. 22, the phase-shifting layer 350 is patterned to form the design layout pattern EUV mask 400 having first and second regions, 410 and 420. The phase-shifting layer 350 is patterned by removing material from the second region 420 while the material remains in the first region 410. The patterned phase-shifting layer produces an about 180-degree phase shift (for the reflected light ray from the first region 410 with respect to the reflected light ray from the second region 420). In the depicted embodiment, in the EUV mask 400 consisting of a layout of low pattern density, the distance between two polygons in the layout is not smaller than about $\lambda$/NA. As an example, the low pattern density layer mask 400 is a via layer mask and the second region 420 represent via patterns. Actually, according to the explanation stated above, either the first region 410 or the second region 420 can be used to define via patterns.

The phase-shifting layer 350 can be patterned by various patterning techniques. One such technique includes using a resist coating (e.g., spin-on coating), soft baking, mask aligning, exposure, post-exposure baking, developing the resist, rinsing, and drying (e.g., hard baking). An etching process is followed to remove portions of the phase-shifting layer 350 and form the first region 410. The etching process may include dry (plasma) etching, wet etching, and/or other etching methods. For example, the dry etching process may implement a fluorine-containing gas (e.g., CF4, SF6, CH2F2, CHF3, and/or C2F6), chlorine-containing gas (e.g., C12, CHC13, CC14, and/or BC13), bromine-containing gas (e.g., HBr and/or CHBR3), iodine-containing gas, other suitable gases and/or plasmas, and/or combinations thereof. Alternative patterning processes include maskless photolithography, electron-beam writing, direct-writing, and/or ion-beam writing.

Based on the above, the present disclosure offers the EUVL process 210 employing a nearly on-axis illumination, e.g., a disk illumination with partial coherence $\sigma$ smaller than 0.3 to expose a mask to produce diffracted light and non-diffracted light. The EUVL process 210 employs a pupil filter to removes more than 70% of the non-diffracted light so as to obtain the benefit of throughput enhancement. The EUVL process 210 also employs a mask with two regions formed by a patterned phase-shifting layer over the ML. The EUVL process 210 demonstrates an enhancement of aerial image contrast and throughput improvement of low pattern density layer.

The present disclosure is directed towards lithography systems and processes. In one embodiment, an extreme ultraviolet lithography (EUVL) process comprises receiving a mask. The mask includes a low thermal expansion material (LTEM) substrate, a reflective multilayer (ML) over one surface of the LTEM substrate, a first region having a phase-shifting layer over the reflective ML, and a second region having no phase-shifting layer over the reflective ML. The EUVL process also comprises exposing the mask by a nearly on-axis illumination with partial coherence $\sigma$ less than 0.3 to produce diffracted light and non-diffracted light, removing at least a portion of the non-diffracted light, and collecting and directing the diffracted light and the not removed non-diffracted light by a projection optics box (POB) to expose a target.

In another embodiment, an extreme ultraviolet lithography (EUVL) process comprises receiving a mask. The mask has a first region and a second region. The phase difference between the first region and the second region is about 180 degrees and the reflectivity of the first region is more than 20% of the reflectivity of the second region. The EUVL process also comprises exposing the mask by a nearly on-axis illumination with partial coherence $\sigma$ less than 0.3 to produce diffracted light and non-diffracted light, removing more than 70% of the non-diffracted light, and collecting and directing the diffracted light and the not removed non-diffracted light by a projection optics box (POB) to expose a semiconductor wafer.

The present disclosure is also directed towards masks. In still another embodiment, a mask for extreme ultraviolet lithography (EUVL) comprises a low thermal expansion material (LTEM) substrate, a reflective multilayer (ML) over one surface of the LTEM substrate, a conductive layer above an opposite surface of the LTEM substrate, a patterned phase-shifting layer over the reflective ML to define a first region and a second region. The phase difference between the first region and the second region is about 180 degrees and the reflectivity of the region with the phase-shifting layer is more than 20% of the reflectivity of the region without the phase-shifting layer.

Another embodiment of the present disclosure is described below with reference to FIGS. 23-31.

Figure 23C:
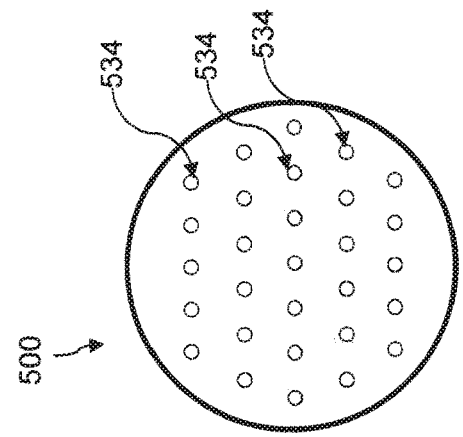
FIGS. 23A through 23C are diagrammatic top views of an illuminator used in the lithography system of FIG. 3, constructed according to aspects of the present disclosure in various embodiments.
Figure 23B:
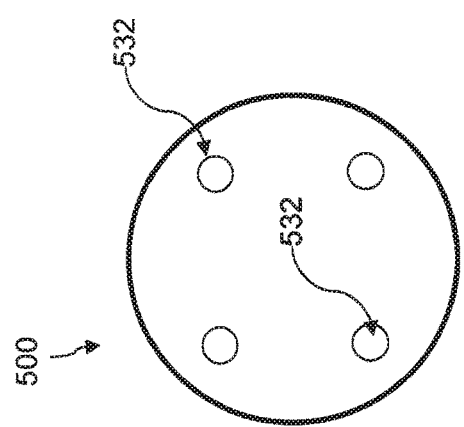
Figure 23A:
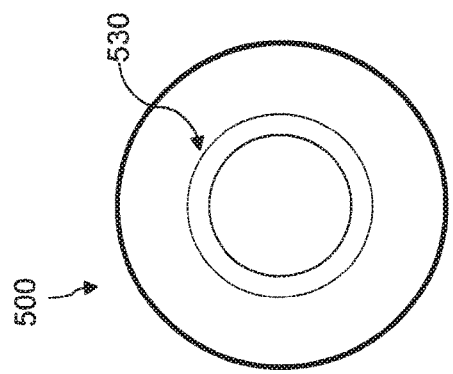

FIGS. 23A, 23B, and 23C illustrate planar views of different examples of an illuminator 500. The illuminator 500 is similar to the illuminator discussed above with reference to FIGS. 9A-9B. For example, the illuminator 500 includes various switchable mirrors (or mirrors with other suitable mechanism) to tune the reflections of the EUV light (generated from the radiation source 32, as discussed above in FIG. 2) from those mirrors. Similar to the illuminator discussed above, the illuminator 500 can achieve an off-axis illumination mode.

As is shown in FIGS. 23A-23C, the illuminator 500 may have different patterns. In FIG. 23A, the illuminator 500 has an annular pattern 530 (also referred to as annular portion). The annular portion 530 is the region being transparent (or in "on" state) to the EUV light from the radiation source 32. The other portions (the rest of the illuminator 500) are in "off" state (blocking). The "on" region means that when the EUV light reaches the region, it will be directed to the mask 36 of FIG. 2. The "off" region means that when the EUV light reaches the region, it will be blocked from reaching the mask 36. Thus, for the example in FIG. 23A, the EUV light reaching the annular portion 530 will be directed to the mask 36, while the EUV light reaching the "off" portions will be blocked.

In FIG. 23B, the illuminator 500 has a quasar pattern 532. The quasar pattern 532 includes a plurality of quasar portions 532 (four in this example) distributed similar to the four corners of a square. The quasar portions 532 are in "on" state, and the remaining portions of the illuminator are in "off" state. In other words, the EUV light reaching the quasar portions 532 will be directed to the mask 36, while the EUV light reaching the remaining portions will be blocked.

In FIG. 23C, the illuminator 500 has a scattering pattern 534, which include a plurality of "on" portions 534 scattered throughout the illuminator 500. The EUV light directed to the scattering portions 534 will be directed to the mask 36 while the EUV light to the remaining portions of the illuminator 500 will be blocked.

Figure 24C:
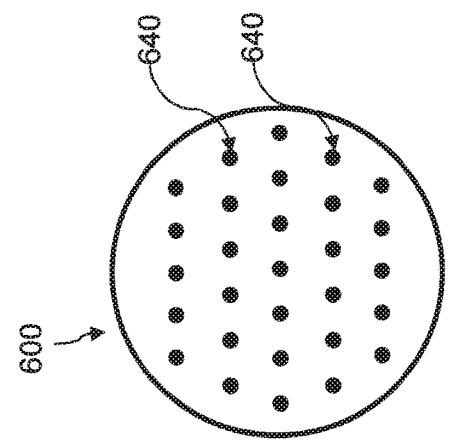
FIGS. 24A through 24C are diagrammatic planar views of a pupil phase modulator used in the lithography system of FIG. 3, constructed according to aspects of the present disclosure in various embodiments.
Figure 24B:
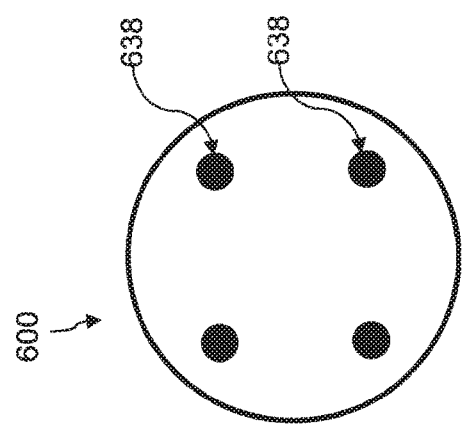
Figure 24A:
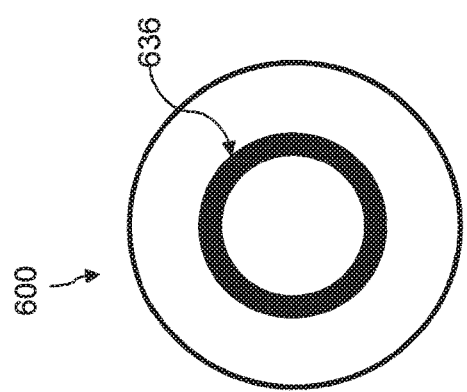

FIGS. 24A, 24B, and 24C illustrate planar views of different examples of a pupil phase modulator 600 according to embodiments of the present disclosure. Similar to the pupil filter 54 discussed above, the pupil phase modulator 600 is positioned in a pupil plane of the lithography system 30, which is a plane with a field distribution corresponding to a Fourier Transform of the mask 36 in the present disclosure. Unlike the pupil filter, however, the pupil phase modulator is not configured to filter out specific spatial frequency components of the EUV light directed from the mask 36, but rather to change or shift a phase of the 0-th order diffracted ray discussed above. For example, in some embodiments, the pupil phase modulator 600 is designed such that a 0-th order diffracted ray (such as the 0-th order ray 51 of FIG. 3) is phase-inverted by 180 degrees.

This phase-inversion of the 0-th order diffracted ray is illustrated in FIGS. 25A and 25B. In more detail, FIG. 25A is a diagrammatic view of a spatial distribution of EUV light before phase-inverting the 0-th order diffracted light, and FIG. 25B is a diagrammatic view of a spatial distribution of EUV light after phase-inverting the 0-th order diffracted light. The horizontal axis represents spatial dimension, and the vertical axis represents the amplitude of the EUV light. The horizontal axis intersects the vertical axis at a zero amplitude of the EUV light.

The 0-th order diffracted light ray and the higher order diffracted light rays are illustrated separately in both FIG. 25A and FIG. 25B. In more detail, FIG. 25A illustrates a 0-th order diffracted light ray 602A without phase inversion, and the ray 602A has a negative amplitude 605A. FIG. 25B illustrates the higher order diffracted light rays without phase inversion, and they have a negative floor amplitude 615. In other words, while the light amplitude corresponding to the first mask state (e.g., the main feature 80) discussed above has an amplitude that is mostly positive, the light amplitude corresponding to the second mask state (e.g., the field 82) discussed above may have a negative amplitude 615. This negative amplitude may be referred to as the floor amplitude, which is negative in this example.

In the embodiment illustrated herein, the magnitude or absolute value of the amplitude 605A is greater than the amplitude 615. That is, the amplitude 605A of the 0-th order diffracted light ray 602A is "more negative" than the floor amplitude 615 of the higher order diffracted light rays 610. The 0-th order diffracted light ray 602A and the high order diffracted light rays 610 combine to produce a combined light 620A, which also has a negative floor amplitude 625A, since both the amplitude 605A of the diffracted 0-th order light ray 602A and the amplitude 615 of the higher order diffracted light rays are negative.

In comparison, the 0-th order diffracted light ray 602B in FIG. 25B has undergone phase inversion, for example a phase inversion of 180 degrees. Consequently, the phase-inverted light ray 602B has a positive amplitude 605B. As discussed above, the phase inversion of the 0-th order diffracted light 602A is accomplished by the pupil phase modulator 600 of the present disclosure.

The pupil phase modulator 600 is also specifically configured to attenuate the magnitude of the amplitude 605A of the 0-th order diffracted light ray 602A by a predetermined ratio. As such, the phase-inverted light ray 602B has a smaller magnitude (or absolute) value for its amplitude 605B than the amplitude 605A of the non-inverted light ray 602A, even though the amplitude 605B is positive, and the amplitude 605A is negative. The amplitude attenuation herein is performed so that the phase-inverted light 0-th order ray 602B, after being combined with the higher order rays 610 (which is the same in both FIGS. 25A and 25B, since the pupil phase modulator 600 does not phase invert the higher order diffracted light), will produce a combined light 620B whose floor amplitude 625B is substantially zero. In other words, the pupil phase modulator 600 attenuates, and inverts, the amplitude of the 0-th order diffracted light ray so that the phase-inverted amplitude (now positive) cancels out the negative amplitude 615 of the higher order diffracted light rays 610. The end result—the light 620B—is an improvement over the light 620A that would have been produced without the amplitude attenuation and the phase-inversion by the pupil phase modulator 600 herein. Among other things, the light 620B offers improved throughput.

The pupil phase modulator 600 achieves the phase-inversion and the amplitude attenuation discussed above by carefully configuring its shape and material compositions. Referring back to FIGS. 24A-24C, the pupil phase modulator 600 has a planar shape that corresponds or matches the illuminator 500. In other words, the pattern in the pupil phase modulator 600 is substantially similar to the pattern of the corresponding illumination mode. For example, when the illumination mode is defined as the annular pattern in FIG. 23A, the pattern of the pupil phase modulator 600 is also the same annular pattern 636 illustrated in FIG. 24A. However, the pattern of the pupil phase modulator 600 in FIG. 24A is complimentary to the pattern defined in the illumination mode in FIG. 23A. Particularly, the annular portion 636 is configured to provide the phase inversion and amplitude attenuation for the 0-th order diffracted ray discussed above. The remaining portions of the pupil phase modulator 600 may be transparent, for example as a void or a vacuum, and as such they may be referred to be in an "on" state. Thus, EUV light reaching the portions of the pupil phase modulator 600 other than the annular pattern 636 will be directed to the target wafer.

Similarly, when the illumination mode is defined in FIG. 23B, the corresponding pupil phase modulator 600 will have a pattern illustrated in FIG. 24B, wherein the quasar portions 638 are configured to provide the phase inversion and amplitude attenuation for the 0-th order diffracted ray, while the other portions are in the "on" state (e.g., being a void). In another example, when the illumination mode is defined in FIG. 23C, the corresponding pupil phase modulator 600 will have a pattern illustrated in FIG. 24C, wherein the scattering portions 640 are configured to provide the phase inversion and amplitude attenuation for the 0-th order diffracted ray, while the other portions are in the "on" state (e.g., being a void or vacuum).

It is understood that the patterns 636, 638 and 640 of the pupil phase modulator 600 need not be an exact match of the corresponding patterns 530, 532, and 534 of the illuminator 500. For example, in some embodiments, the patterns 636, 638 and 640 may be slightly larger than the corresponding patterns 530, 532, and 534 of the illuminator 500, so as to provide a margin to cover the patterns 530, 532, and 534.

In the embodiments illustrated in FIGS. 24A-24C, the pupil phase modulator 600 is a device that may be switched in or out of the EUV lithography system depending on the illuminator type. For example, if an annular illumination mode is needed, the pupil phase modulator 600 of FIG. 24A may be loaded into the EUV lithography system. If a quasar illumination mode is needed, the pupil phase modulator 600 of FIG. 24A may then be replaced with the pupil phase modulator 600 of FIG. 24B.

It is also understood that, as a practical matter, support structures may be implemented to connect or support the patterns 636, 638, or 640. For example, referring to FIGS. 26A-26B, the pupil phase modulator 600 with the annular pattern 636 and the pupil phase modulator 600 with the quasar pattern 638 are illustrated, respectively. Each pupil phase modulator 600 may have an outer ring or rim, which may define an outer boundary 650 of the pupil phase modulator 600. The annular pattern 636 or the quasar pattern 638 are implemented with one or more phase-shifting layers (and supporting layers), which will be discussed below in more detail. The patterns 636 and 638 provide the phase shifting and the amplitude attenuation for the 0-th order ray.

However, the rest of the pupil phase modulator 600, for example regions 660, are in the "ON" state and are transparent. In some embodiments, these regions 660 may be a void or a vacuum. Consequently, a mechanical structure is needed to provide support or connection between the patterns 636/638 and the boundary 650. In the embodiment shown in FIGS. 26A-26B, rods 670 may be implemented to connect the annular pattern 636 to the boundary 650, or to connect the quasar pattern 638 to the boundary 650. The number of the rods 670 and the locations of the rods 670 may vary from embodiment to embodiment, depending on the pattern shape and other considerations such as durability, etc.

Figure 27:
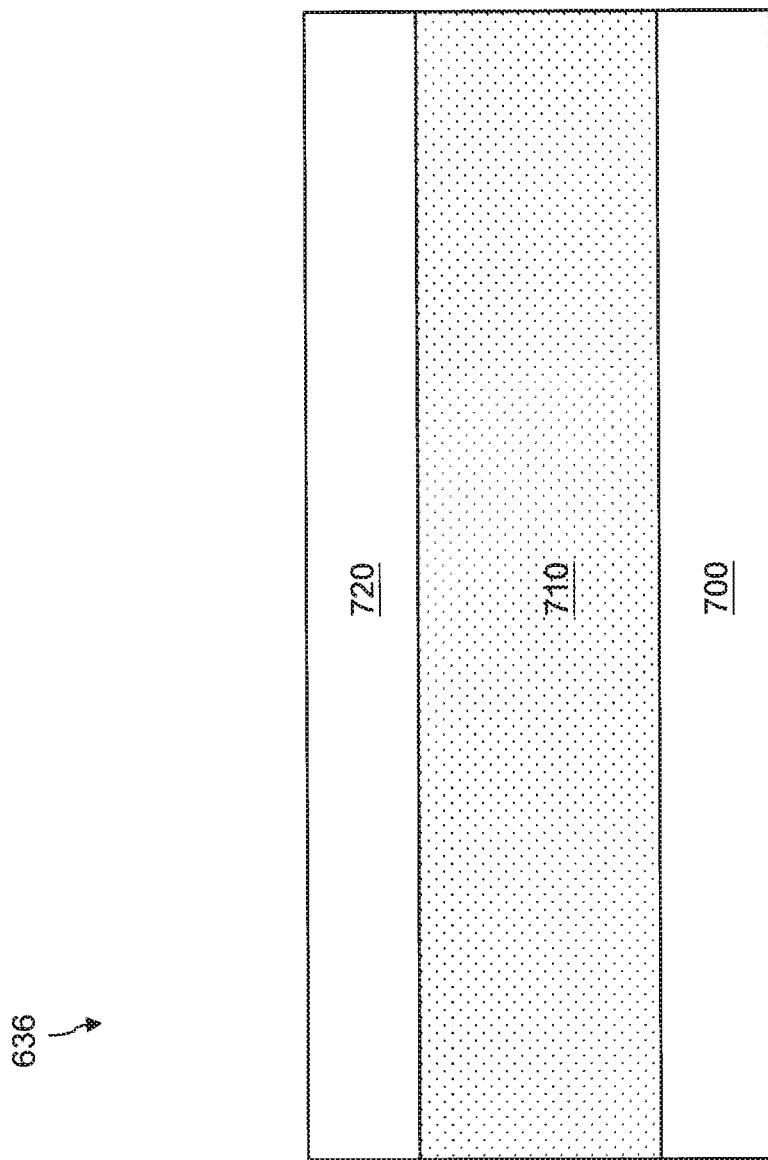

The implementation details of the phase-shifting patterns (e.g., the annular pattern 636 or the quasar pattern 638) are now discussed in more detail with reference to FIG. 27. Specifically, FIG. 27 illustrates a diagrammatic cross-sectional side view of the annular pattern 636 as an example. It is understood that the quasar pattern 638 or the scattering pattern 640 may also be implemented similarly.

The pattern 636 includes a mechanical support layer 700. A phase-shifting layer 710 is disposed over the mechanical support layer 700. Another mechanical support layer 720 is disposed over the phase-shifting layer 710. In some embodiments, the mechanical support layers 700 and 720 each contain silicon. Silicon is selected because it is nearly transparent in the EUV range, and it also has good mechanical properties for serving as mechanical support. In some embodiments, a thickness of each of the mechanical support layers 700 and 720 is configured to be within a range from 50 nanometers (nm) to 3 microns.

The phase-shifting layer 710 may contain a material such as molybdenum, ruthenium, zirconium, nickel, or combinations thereof. These materials are configured to cause a phase shift of about 180 degrees for the 0-th order diffracted light ray. As discussed above with reference to FIGS. 25A-25B, this phase shift inverts the amplitude of the 0-th order diffracted ray from a negative amplitude to a positive amplitude. A thickness of the phase-shifting layer 710 is also configured to attenuate the magnitude of the amplitude of the 0-th order ray. As discussed above with reference to FIGS. 25A-25B, the amplitude attenuation is configured such that the attenuated and phase-inverted amplitude would cancel out the negative floor amplitude of the higher order diffracted rays. Since the amount of the amplitude attenuation depends at least in part on the thickness of the layer 710, the thickness of the layer 710 is carefully configured. For example, a greater thickness may be associated with a greater amount of amplitude attenuation. In some embodiments, the thickness of the layer 710 is in a range from 20 nm to 200 nm.

In some alternative embodiments, the pattern 636 may be implemented with more than one phase-shifting layer, so as to provide additional degrees of freedom in tuning the phase shifting and/or amplitude attenuation. For example, FIGS. 28A, 28B, and 28C each illustrate a diagrammatic cross-sectional side view of an embodiment of the annular pattern 636 that contains more than one phase-shifting layer. Referring to FIG. 28A-28B, the pattern 636 includes the mechanical support layers 700 and 720, as well as phase-shifting layers 710 and 730. In FIG. 28A, the phase shifting layer 730 is disposed between the phase-shifting layer 710 and the mechanical support layer 720, whereas in FIG. 28B, the phase shifting layer 730 is disposed between the phase-shifting layer 710 and the mechanical support layer 700. The phase-shifting layers 710 and 730 have different material compositions. For example, in some embodiments, the phase-shifting layer 710 contains molybdenum, and the phase-shifting layer 730 contains zirconium or nickel. In some embodiments, the thickness for the phase-shifting layer 730 may be in a range from 2 nm to 50 nm.

In the embodiment shown in FIG. 28C, the pattern 636 includes three different phase-shifting layers 710, 730 and 740. The phase-shifting layer 710 is "sandwiched" between the phase-shifting layers 730 and 740, which are collectively "sandwiched" between the mechanical support layers 700 and 720. In some embodiments, the phase-shifting layer 710 contains molybdenum, the phase-shifting layer 730 contains zirconium, and the phase-shifting layer 740 contains nickel. In another embodiment, the phase-shifting layer 710 contains molybdenum, the phase-shifting layer 730 contains nickel, and the phase-shifting layer 740 contains zirconium.

Having more than one phase-shifting layer helps provide additional freedom in attenuating the amplitude of the 0-th order diffracted light. This is at least in part due to the different material compositions of the phase-shifting layers 710, 730, or 740. Using the embodiment shown in FIG. 28C a simplified example, suppose that the phase-shifting layer 710 contains molybdenum, which may attenuate the amplitude by 70%, and the phase-shifting layer 730 contains zirconium, which may attenuate the amplitude by 50%, and that the phase-shifting layer 740 contains nickel, which may attenuate the amplitude by 60%. Given these parameters, the respective thicknesses of these layers 710, 730, and 740 may be configured using various linear combinations to derive a desired amplitude attenuation percentage, for example 65%. In some embodiments, the thickness of the phase-shifting layer 710 is in a range from 20 nm to 200 nm, and the thickness of the phase-shifting layers 730 and 740 are each in a range from 2 nm to 50 nm.

In some embodiments, the thickness of the layer 730 or 740 may be optionally further configured to reduce unwanted reflection. For example, the thickness of the layer 730 (or 740) may be set to be equal to $(n+0.5)*(\lambda/2)$, where n is an integer in a range from 0 to 30 (for example from 0 to 20), and $\lambda$ is the wavelength of the EUV light (e.g., 13.5 nm). Setting the thickness of the layers 730 (and/or 740) according to the equation $(n+0.5)*(\lambda/2)$ helps minimize the destructive interference at the layer interfaces, thereby minimizing unwanted reflection. After setting the thickness of the phase-shifting layer 730 (and 740 if 740 is also implemented), the thickness of the phase-shifting layer 710 may then be calculated, so that the phase-shifting layers 710 and 730 (and 740 if it is implemented) collectively may attenuate the 0-th order diffraction light ray by a predetermined percentage or ratio.

It is understood that the materials (molybdenum, zirconium, nickel, or ruthenium) of the phase-shifting layers 710, 730, and 740 discussed herein are optimized for a 13.5 nm EUV light. However, the concepts of the present disclosure also applies to other EUV light wavelengths, though the material compositions and/or the thicknesses of the phase-shifting layers may need to be reconfigured to optimize the phase-inversion and the amplitude attenuation for the 0-th order diffraction ray if another EUV light with a different wavelength is used.

It is also understood that the attenuation percentage or ratio of the 0-th order diffraction light may change somewhat depending on the illumination mode. For example, the annular type illuminator may correspond to a first desired amplitude attenuation percentage, the quasar type illuminator may correspond to a second desired amplitude attenuation percentage, and the scattering type illuminator may correspond to a third desired amplitude attenuation percentage, where the first, second, and third percentages are different from one another. As such, the present disclosure may customize the thicknesses of the phase-shifting layer(s) in the pupil phase modulator 600 to account for each type of illuminator.

Figure 26B:
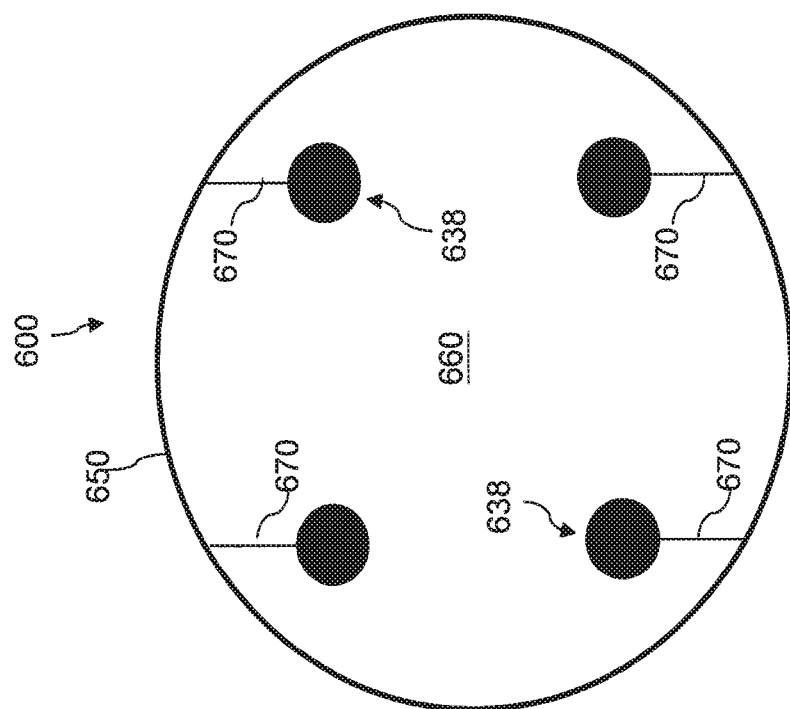
FIGS. 26A through 26B are diagrammatic planar views of a pupil phase modulator used in the lithography system of FIG. 3, constructed according to aspects of the present disclosure in various embodiments.
Figure 26A:
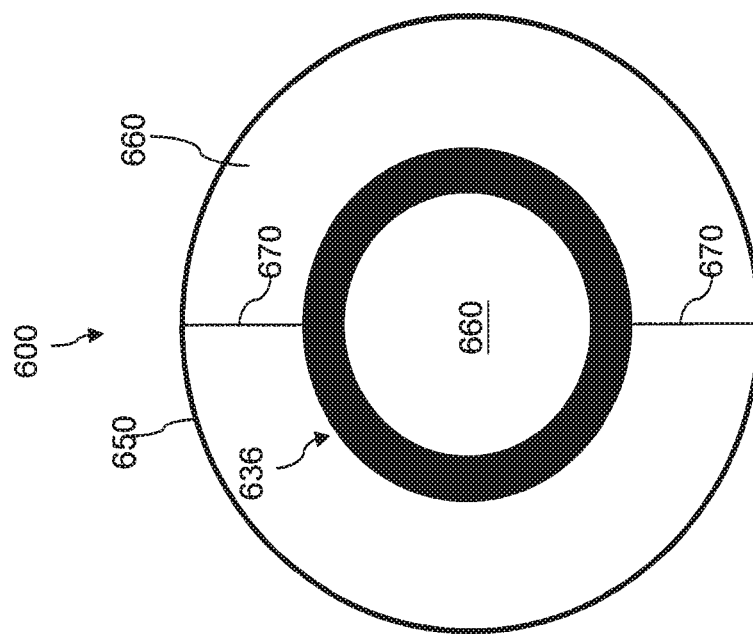

Again, it is understood that each of the patterns 636, 638, and 640 discussed above may be implemented using the structures illustrated in FIGS. 27 and 28A-28C that contain either a single phase-shifting layer or multiple phase-shifting layers. Most of the remaining regions of the pupil phase modulator 600—e.g., the regions 660 shown in FIGS. 26A-26B—may be implemented as a void or a vacuum. However, as also shown in FIGS. 26A-26B, mechanical support structures such as the rods 670 may be used to establish a mechanical connection between the patterns 636/638 to the boundary 650 of the pupil phase modulator 600. This approach is certainly feasible and offers the advantages such as increased throughput. However, a potential issue may arise due to the presence of the mechanical support structures such as the rods 670. Even if the rods 670 are implemented as silicon (which is closed to being transparent in the EUV spectrum), there may still be lack of uniformity due to the difference between the rods 670 and the regions 660, which are voids or vacuum. This may have potentially adverse effects on the image quality.

Figure 29A:
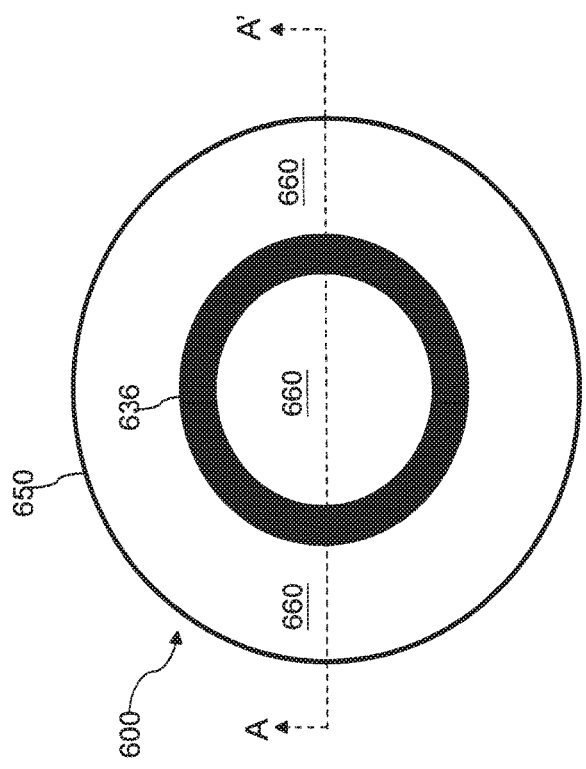
FIGS. 29A-29B are diagrammatic planar and cross-sectional views of a pupil phase modulator according to embodiments of the present disclosure.
Figure 29B:
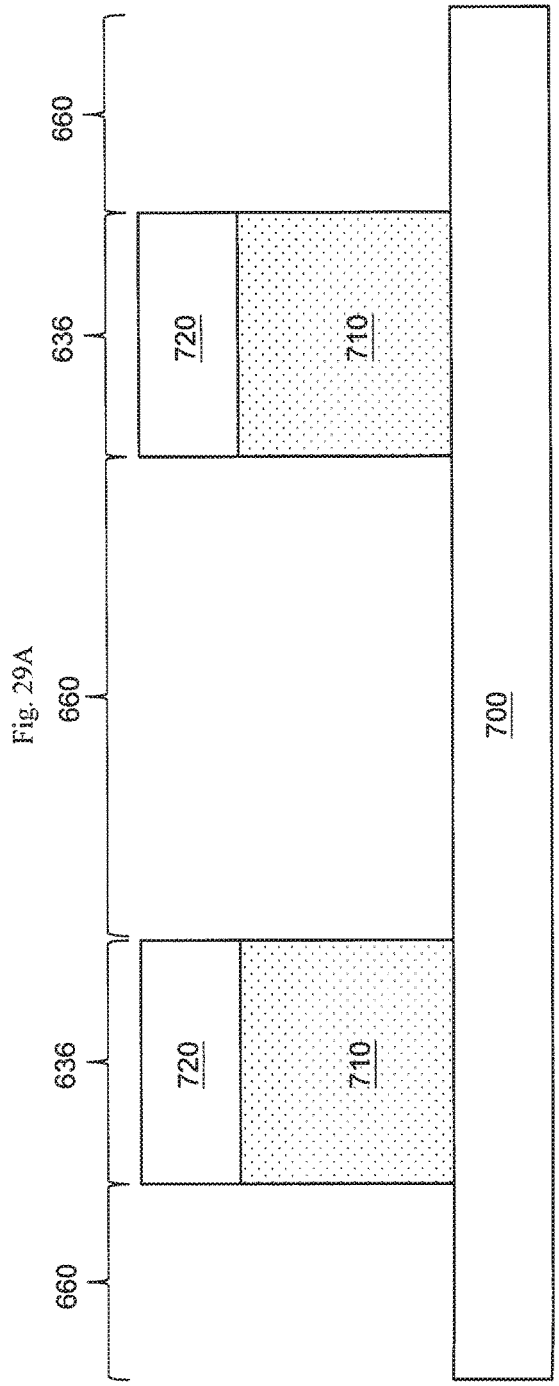

Therefore, if image quality is an important concern, the pupil phase modulator 600 may also be implemented according to an alternative embodiment shown in FIGS. 29A-29B. In more detail, FIG. 29A is a simplified diagrammatic planar view the pupil phase modulator 600 using the annular pattern 636 as an example, and FIG. 29B is a simplified diagrammatic cross-sectional side of the pupil phase modulator 600 of FIG. 29A, where the cross-section is taken from point A to point A'. The annular pattern 636 is implemented in a manner similar to the embodiment discussed above with reference to FIG. 27, in that it contains mechanical support layers 700 and 720 and a phase-shifting layer 710 disposed in between. However, the embodiment shown in FIG. 29B has an extended mechanical support layer 700 that extends laterally beyond the planar view boundaries of the annular pattern 636. This extended mechanical support layer 700 may also be referred to as a silicon membrane 700.

As is shown in the planar view of FIG. 29A, this embodiment of the pupil phase modulator 600 no longer needs the mechanical support structures 670, because the mechanical support layer 700 of the annular pattern 636 extends laterally throughout the pupil phase modulator 600 to provide the needed mechanical support. In this manner, the annular pattern 636 does not need to be connected to the rod 670 in order to avoid being a "free-floating" structure, since the annular pattern 636 (containing the layers 710-720) is "sitting" on the mechanical support layer 700 that now extends throughout the pupil phase modulator 600. By doing so, the pupil phase modulator 600 in FIGS. 29A-29B has improved uniformity, since the regions 660 is now comprised of the mechanical support layer 700, compared to the previous embodiment where the regions 660 are comprised of both the rods 670 and void or vacuum.

To minimize the light absorption, the mechanical support layer 700 may be implemented as a silicon layer. However, the presence of the mechanical support layer 700 (even if it's implemented with silicon, which is close to being transparent) may still reduce throughput a little bit compared to the embodiment discussed above with reference to FIGS. 26A-26B. As such, a tradeoff may be made in each case between image quality and throughput, where the pupil phase modulator 600 may be implemented using the embodiment shown in FIGS. 26A-26B (with the connection rods 670) if throughput is a greater concern, and the pupil phase modulator 600 may be implemented using the embodiment shown in FIGS. 29A-29B (without the connection rods 670 but with a silicon membrane 700 extending throughout the pupil phase modulator 600) if image quality is a greater concern.

It is understood that the layers of the annular pattern 636 itself in the embodiment shown in FIGS. 29A-29B may also be configured differently than the corresponding layers of the embodiment shown in FIGS. 26A-26B. In the embodiment shown in FIGS. 29A-29B, a 180 degree phase shift is desired between the annular pattern 636 and the regions 660. As such, the thicknesses of the layers of the annular pattern 636 may need to be changed slightly, to account for the additional phase shift (however slight it may be) caused by the silicon membrane 700. For example, the thickness of the phase-shifting layer 710 may be increased compared to the embodiment of FIGS. 26A-26B, in order to compensate for the extra phase shift caused by the silicon membrane 700.

It is understood that the rod-free pupil phase modulator 600 (having the silicon membrane 700 structure shown in FIGS. 29A-29B) scheme may also apply to other embodiments where multiple phase-shifting layers are implemented, such as the embodiments discussed above with reference to FIGS. 28A-28C. Regardless of the specific embodiment, it is understood that additional reconfiguring of the thicknesses (and/or the material compositions) of the phase-shifting layers may be needed to compensate for the additional phase shift introduced by the presence of the silicon membrane in the regions 660.

Yet another alternative embodiment of the pupil phase modulator 600 is shown in FIGS. 30A-30B, where FIG. 30A illustrates a simplified diagrammatic planar view of the pupil phase modulator 600, and FIG. 30B illustrates a simplified diagrammatic cross-sectional side of the pupil phase modulator 600 of FIG. 30A, where the cross-section is taken from point A to point A'. The embodiment of the pupil phase modulator 600 in FIGS. 30A-30B is substantially similar to the embodiment shown in FIGS. 29A-29B, except that the mechanical support layer 700 (i.e., the silicon membrane 700) is also filling the gaps between the annular patterns 636. Again, the phase-shifting layer(s) may need to be reconfigured slightly (e.g., by adjusting its thickness) to compensate for the additional phase shift attributed to the extra silicon membrane 700.

It is understood that the embodiments discussed above may offer optimal throughput improvement for IC patterns with a low pattern density, such as the IC pattern 160 discussed above with reference to FIG. 14. For example, the IC pattern 160 may include low pattern density features 162 that are vias. Other examples of low pattern density features may include cuts patterns with a plurality of cut features designed to form a circuit pattern (such as gates or metal lines) with one or more main patterns defined on corresponding mask by two or more exposures.

On reason for the improvement with respect to the low pattern density is that the 0-th order diffraction light corresponding low pattern density features has a greater negative amplitude (i.e., more negative) than for the high pattern density features. The greater negative amplitude enables the 0-th order diffraction ray to be inverted and then attenuated accordingly to cancel out the negative floor amplitude for the higher order diffraction light. In the case of high pattern density, the 0-th order diffraction light is less negative (e.g., closer to zero even though it is negative), and thus even if it is phase inverted, it may not be sufficient to cancel out the negative floor amplitude of the higher order diffraction light rays.

Nevertheless, it is understood that the present disclosure may still be incorporated for high pattern density features to improve throughput and image quality, though these improvements may be more significant for low pattern density features (e.g., having a pattern density less than 20% or 10%). In addition to throughput improvements, the pupil phase modulator 600 of the present disclosure may also offer MEEF enhancements and reduced printability of particles on the mask for reasons similar to those discussed above with reference to FIGS. 14-18.

Figure 31:
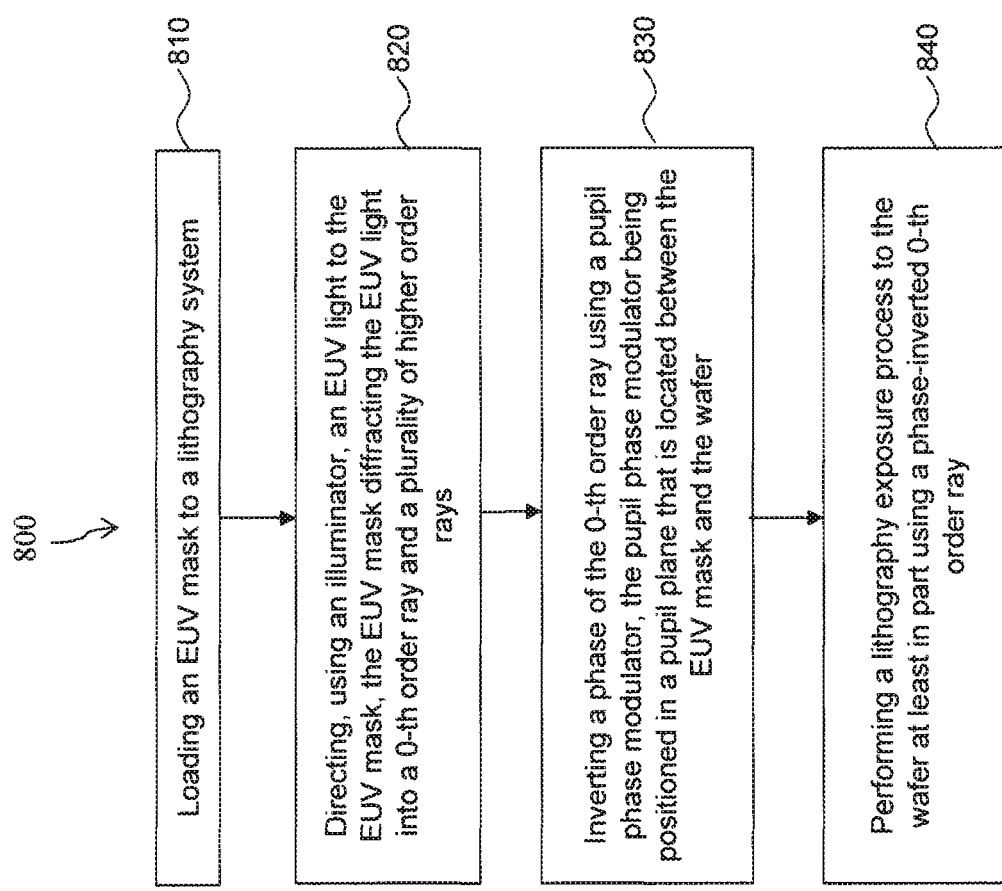
FIG. 31 is a flowchart of a lithography process constructed according to aspects of the present disclosure in various embodiments.

FIG. 31 is a flowchart illustrating a method 800 of performing an extreme ultraviolet lithography (EUVL) process to a wafer.

The method 800 includes a step 810 of loading an EUV mask to a lithography system.

The method 800 includes a step 820 of directing, using an illuminator, an EUV light to the EUV mask. The EUV mask diffracts the EUV light into a 0-th order ray and a plurality of higher order rays.

The method 800 includes a step 830 of inverting a phase of the 0-th order ray using a pupil phase modulator. The phase modulator includes one or more phase-shifting layers having different material compositions from one another and one or more mechanical support layers configured to provide mechanical support to the one or more first phase-shifting layers. In some embodiments, the one or more phase-shifting layers contain molybdenum, zirconium, ruthenium, or nickel, and the one or more mechanical support layers each contain silicon. The pupil phase modulator is positioned in a pupil plane that is located between the EUV mask and the wafer. The pupil phase modulator has a planar view that substantially corresponds with a planar view of the illuminator.

The method 800 includes a step 840 of performing a lithography exposure process to the wafer at least in part using a phase-inverted 0-th order ray.

In some embodiments, the higher order rays have a negative floor amplitude, and a phase-inverted 0-th order ray has a positive amplitude. The method 800 may further include a step of attenuating, using the pupil phase modulator, an amplitude of the 0-th order ray such that the positive amplitude of the phase-inverted 0-th order ray substantially cancels out the negative floor amplitude of the higher order rays.

One embodiment of the present disclosure includes a lithography system. The lithography system includes a radiation source configured to generate an extreme ultraviolet (EUV) light. The lithography system includes a mask that defines one or more features of an integrated circuit (IC). The lithography system includes an illuminator configured to direct the EUV light onto the mask. The mask diffracts the EUV light into a 0-th order ray and a plurality of higher order rays. The lithography system includes a wafer stage configured to secure a wafer that is to be patterned according to the one or more features defined by the mask. The lithography system includes a pupil phase modulator positioned in a pupil plane that is located between the mask and the wafer stage. The pupil phase modulator is configured to change a phase of the 0-th order ray.

Another embodiment of the present disclosure includes a pupil phase modulator. The pupil phase modulator includes a phase-shifting layer configured to shift a phase of a 0-th order ray. The 0-th order ray is one of a plurality of rays that are diffracted by an extreme ultraviolet (EUV) mask in response to an incident EUV light directed onto the EUV mask. The pupil phase modulator includes one or more mechanical support layers configured to provide mechanical support for the phase-shifting layer.

Yet another embodiment of the present disclosure includes a method of performing an extreme ultraviolet lithography (EUVL) process to a wafer. An EUV mask is loaded to a lithography system. Using an illuminator, an EUV light is directed to the EUV mask. The EUV mask diffracts the EUV light into a 0-th order ray and a plurality of higher order rays. A phase of the 0-th order ray is inverted using a pupil phase modulator. The pupil phase modulator being positioned in a pupil plane that is located between the EUV mask and the wafer. The pupil phase modulator has a planar view that substantially corresponds with a planar view of the illuminator. A lithography exposure process is performed to the wafer at least in part using a phase-inverted 0-th order ray.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography system, comprising:
   a radiation source configured to generate radiation;
   a mask that defines one or more features of an integrated circuit (IC);
   an illuminator configured to direct the radiation onto the mask, wherein the illuminator includes a first pattern;
   a wafer stage configured to hold a wafer; and
   a pupil phase modulator located between the mask and the wafer stage, wherein the pupil phase modulator includes a second pattern, wherein the second pattern is defined by a mechanical support layer and a plurality of phase-shifting layers disposed over the mechanical support layer.

2. The lithography system of claim 1, wherein:
   the plurality of phase-shifting layers includes a first phase-shifting layer having a first material composition and a second phase-shifting layer having a second material composition different from the first material composition.

3. The lithography system of claim 2, wherein:
   the first material composition includes molybdenum; and
   the second material composition includes zirconium or nickel.

4. The lithography system of claim 2, wherein:
the mechanical support layer is a first mechanical support layer;
the pupil phase modulator further includes a second mechanical support layer;
the first phase-shifting layer is disposed between the first mechanical support layer and the second phase-shifting layer; and
the second phase-shifting layer is disposed between the first phase-shifting layer and the second mechanical support layer.

5. The lithography system of claim 2, wherein the plurality of phase-shifting layers further includes a third phase-shifting layer having a third material composition that is different from the first material composition and from the second material composition.

6. The lithography system of claim 1, wherein:
the pupil phase modulator includes a first region and a second region;
the phase-shifting layers are located in the first region but not the second region; and
the mechanical support layer is located in both the first region and the second region.

7. The lithography system of claim 1, wherein:
the phase-shifting layers are opaque with respect to the radiation generated by the radiation source; and
the mechanical support layer is transparent with respect to the radiation generated by the radiation source.

8. The lithography system of claim 1, wherein the radiation source is configured to generate Extreme Ultraviolet (EUV) light as the radiation.

9. A pupil phase modulator, comprising:
a mechanical support layer;
a first phase-shifting layer disposed over the mechanical support layer, wherein the first phase-shifting layer is configured to shift a phase of a light that is diffracted by a lithography mask; and
a second phase-shifting layer disposed over the first phase-shifting layer, wherein the second phase-shifting layer is configured to further shift the phase of the light, and wherein the first phase-shifting layer and the second phase-shifting layer have different material compositions.

10. The pupil phase modulator of claim 9, wherein:
the first phase-shifting layer contains molybdenum; and
the second phase-shifting layer contains zirconium or nickel.

11. The pupil phase modulator of claim 9, wherein the mechanical support layer is transparent.

12. The pupil phase modulator of claim 9, wherein the mechanical support layer includes a silicon membrane.

13. The pupil phase modulator of claim 9, wherein the first phase-shifting layer and the second phase-shifting layer collectively define an opaque pattern in a top view.

14. The pupil phase modulator of claim 13, wherein the opaque pattern has an annular shape or a quasar shape in the top view.

15. The pupil phase modulator of claim 9, wherein:
the mechanical support layer is a first mechanical support layer;
the pupil phase modulator further comprises a second mechanical support layer; and
the first phase-shifting layer and the second phase-shifting layer are disposed between the first mechanical support layer and the second mechanical support layer.

16. The pupil phase modulator of claim 9, further comprising a third phase-shifting layer disposed over the second phase-shifting layer, wherein the third phase-shifting layer is configured to further shift the phase of the light, and wherein the third phase-shifting layer has a different material composition than the first phase-shifting layer and the second phase-shifting layer.

17. The pupil phase modulator of claim 9, wherein the first phase-shifting layer and the second phase-shifting layer is laterally surrounded by vacuum.

18. A method of performing a lithography process to a wafer, comprising:
loading a lithography mask to a lithography system;
directing, using an illuminator, a light in an extreme ultraviolet (EUV) range to the lithography mask, wherein the illuminator includes a first pattern; and
shifting at least a phase of at least a portion of the light using a pupil phase modulator, the pupil phase modulator including a second pattern that corresponds with the first pattern in a top view, wherein the second pattern is defined by a first phase-shifting layer located on a mechanical support layer and a second phase-shifting layer located over the first phase-shifting layer, wherein the first phase-shifting layer and the second phase-shifting layer have different material compositions.

19. The method of claim 18, wherein:
the first pattern transmits the light; and
the second pattern blocks the light.

20. The method of claim 18, wherein the portion of the light is a 0-th order ray that has been diffracted by the lithography mask, and wherein the shifting comprises shifting the phase of the 0-th order ray.

* * * * *